(12) United States Patent
Shimanek et al.

(10) Patent No.: US 8,587,337 B1
(45) Date of Patent: Nov. 19, 2013

(54) METHOD AND APPARATUS FOR CAPTURING AND SYNCHRONIZING DATA

(75) Inventors: Schuyler E. Shimanek, Albuquerque, NM (US); Adam Elkins, Rio Rancho, NM (US); Wayne E. Wennekamp, Rio Rancho, NM (US)

(73) Assignee: Xilinx, Inc., San Jose, CA (US)

( * ) Notice: Subject to any disclaimer, the term of this patent is extended or adjusted under 35 U.S.C. 154(b) by 969 days.

(21) Appl. No.: 12/689,558

(22) Filed: Jan. 19, 2010

Related U.S. Application Data

(60) Provisional application No. 61/148,926, filed on Jan. 31, 2009, provisional application No. 61/148,927, filed on Jan. 31, 2009.

(51) Int. Cl.
*H03K 19/173* (2006.01)
*H04B 1/00* (2006.01)
*H04L 7/00* (2006.01)
*H04L 25/00* (2006.01)
*H04L 25/40* (2006.01)

(52) U.S. Cl.
USPC ............... 326/38; 326/37; 375/144; 375/371

(58) Field of Classification Search
USPC ................. 326/37–41, 47, 101; 327/108, 109
See application file for complete search history.

(56) References Cited

U.S. PATENT DOCUMENTS

| | | | | |
|---|---|---|---|---|
| 8,115,524 | B2 * | 2/2012 | Kim et al. | 327/144 |
| 2006/0262891 | A1 * | 11/2006 | Faulkner | 375/371 |
| 2009/0262875 | A1 * | 10/2009 | Arai | 375/373 |
| 2011/0291719 | A1 * | 12/2011 | Ok | 327/158 |

OTHER PUBLICATIONS

U.S. Appl. No. 12/689,585, filed Jan. 19, 2010, Shimanek, et al., Xilinx, Inc., 2100 Logic Drive, San Jose, CA.
U.S. Appl. No. 12/689,604, filed Jan. 19, 2010, Flateau, Jr., et al., Xilinx, Inc., 2100 Logic Drive, San Jose, CA.
U.S. Appl. No. 12/694,615, filed Jan. 27, 2010, Shimanek, et al., Xilinx, Inc., 2100 Logic Drive, San Jose, CA.
U.S. Appl. No. 12/694,665, filed Jan. 27, 2010, Wennekamp, et al., Xilinx, Inc., 2100 Logic Drive, San Jose, CA.
U.S. Appl. No. 12/694,973, filed Jan. 27, 2010, Shimanek, et al., Xilinx, Inc., 2100 Logic Drive, San Jose, CA.
U.S. Appl. No. 12/689,636, filed Jan. 19, 2010, Wennekamp, et al., Xilinx, Inc., 2100 Logic Drive, San Jose, CA.
U.S. Appl. No. 12/693,397, filed Jan. 25, 2010, Wennekamp, et al., Xilinx, Inc., 2100 Logic Drive, San Jose, CA.
U.S. Appl. No. 12/692,771, filed Jan. 25, 2010, Flateau, Jr., et al., Xilinx, Inc., 2100 Logic Drive, San Jose, CA.

(Continued)

*Primary Examiner* — Shawki Ismail
*Assistant Examiner* — Dylan White
(74) *Attorney, Agent, or Firm* — Murray Smith

(57) ABSTRACT

An embodiment of a technique to capture and locally synchronize data is disclosed. The technique includes receiving first and second signals through a first interface, and receiving a third signal through a second interface where the third signal is unsynchronized with respect to the second signal. The technique further includes detecting a first phase difference between the second and third signals, and generating a fourth signal in a manner so that a second phase difference between the fourth signal and one of the second or third signals is a function of the first phase difference. In addition, the technique includes storing a state of the first signal in response to the fourth signal, and thereafter supplying the stored state of the first signal to the second interface.

20 Claims, 19 Drawing Sheets

(56) References Cited

OTHER PUBLICATIONS

U.S. Appl. No. 12/696,672, filed Jan. 29, 2010, Shimanek, et al., Xilinx, Inc., 2100 Logic Drive, San Jose, CA.
U.S. Appl. No. 12/690,856, filed Jan. 20, 2010, Elkins, et al., Xilinx, Inc., 2100 Logic Drive, San Jose, CA.
U.S. Appl. No. 12/695,341, filed Jan. 28, 2010, Strader, et al., Xilinx, Inc., 2100 Logic Drive, San Jose, CA.
U.S. Appl. No. 12/695,099, filed Jan. 27, 2010, Shimanek, et al., Xilinx, Inc., 2100 Logic Drive, San Jose, CA.
U.S. Appl. No. 12/694,656, filed Jan. 27, 2010, Elkins, et al., Xilinx, Inc., 2100 Logic Drive, San Jose, CA.

* cited by examiner

METHOD AND APPARATUS FOR CAPTURING AND SYNCHRONIZING DATA

CROSS-REFERENCE TO RELATED APPLICATIONS

This application claims benefit of U.S. Provisional patent application having the Application No. 61/148,926 filed on Jan. 31, 2009 and entitled "Apparatus and Method for a Memory Controller"; and also U.S. Provisional patent Application having the Application No. 61/148,927 filed on Jan. 31, 2009 and entitled "Architecture for Advanced Integrated Circuit Providing Good Performance and Low Cost." Both of these provisional patent applications are incorporated herein by reference in their entirety.

FIELD OF THE INVENTION

An embodiment of the invention relates to techniques for communication between two circuits that operate asynchronously. More particularly, an embodiment of the invention relates to techniques by which one circuit can capture and locally synchronize data received from another circuit that operates asynchronously to the capturing circuit.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

A PLD has internal clock signals that control its internal operations. However, a device external to the PLD may use another clock signal that is asynchronous to the PLD's internal clock signals. The asynchronous relationship between the external device's clock signal and the PLD's clock signals may cause problems when the PLD attempts to read data from the external device, possibly resulting in data loss or data error. In addition, the exact timing of the external device's clock signal is generally not known to the PLD, yet the operation of various sections of the PLD may require knowledge of the timing of the external device's clock signal. While existing techniques for handling asynchronous signals have been generally adequate for their intended purposes, they have not been entirely satisfactory in all respects.

SUMMARY OF THE INVENTION

An embodiment of the invention involves an apparatus having circuitry that includes a first interface through which first and second signals are received; a second interface through which a third signal is received, the third signal is unsynchronized with respect to the second signal; a circuit that detects a first phase difference between the second and third signals, and that generates a fourth signal in a manner so that a second phase difference between the fourth signal and one of the second or third signals is a function of the first phase difference; and a storage element having an input to which the first signal is applied, and having an output coupled to the second interface, wherein the storage element, in response to the fourth signal, stores a state of the first signal present at the input thereof and outputs to the output thereof the state stored therein.

Another embodiment of the invention involves a method that includes receiving first and second signals through a first interface; receiving a third signal through a second interface, the third signal is unsynchronized with respect to the second signal; detecting a first phase difference between the second and third signals; generating a fourth signal in a manner so that a second phase difference between the fourth signal and one of the second or third signals is a function of the first phase difference; storing a state of the first signal in response to the fourth signal; and supplying the stored state of the first signal to the second interface.

DETAILED DESCRIPTION

Figure 1:
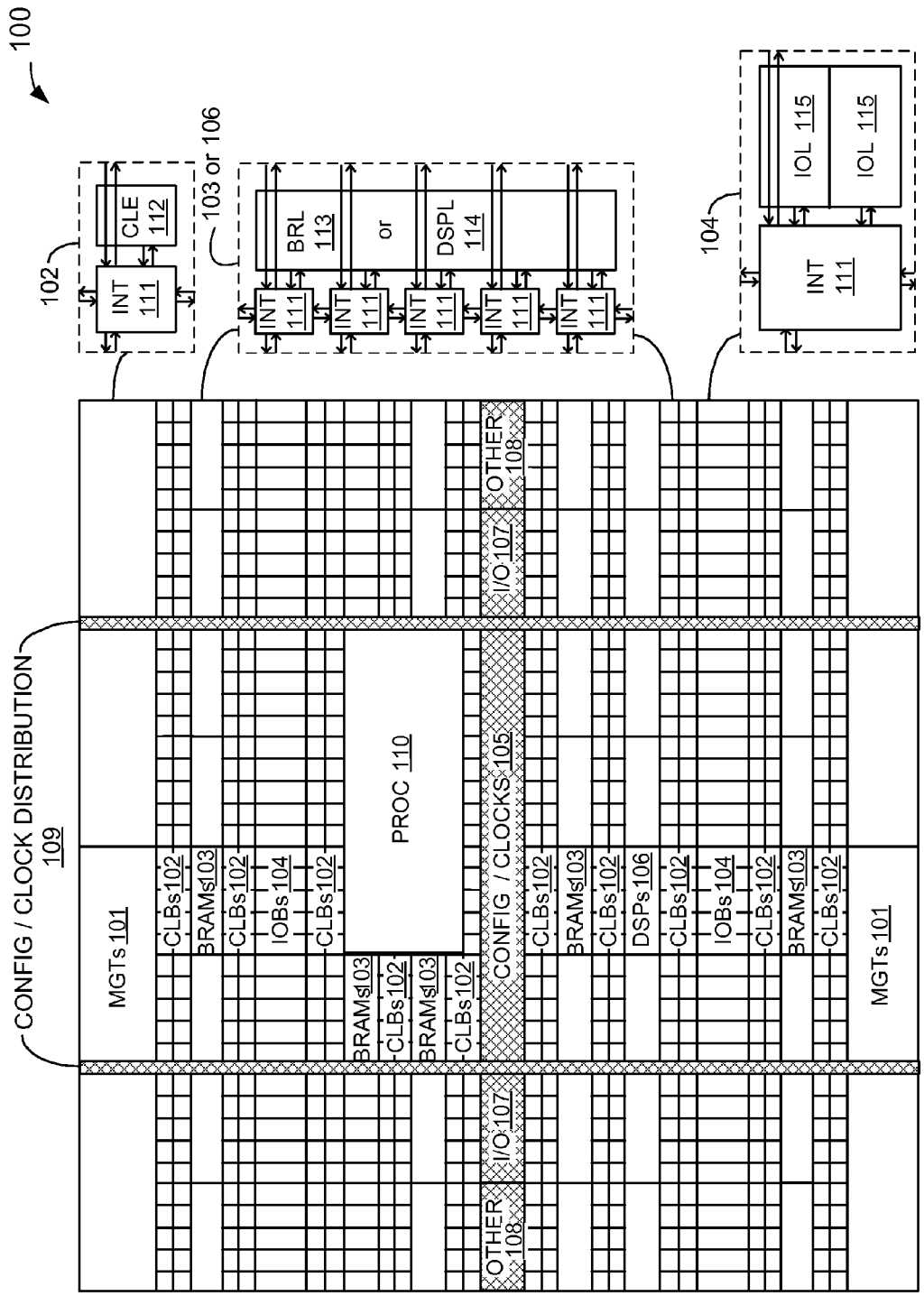
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
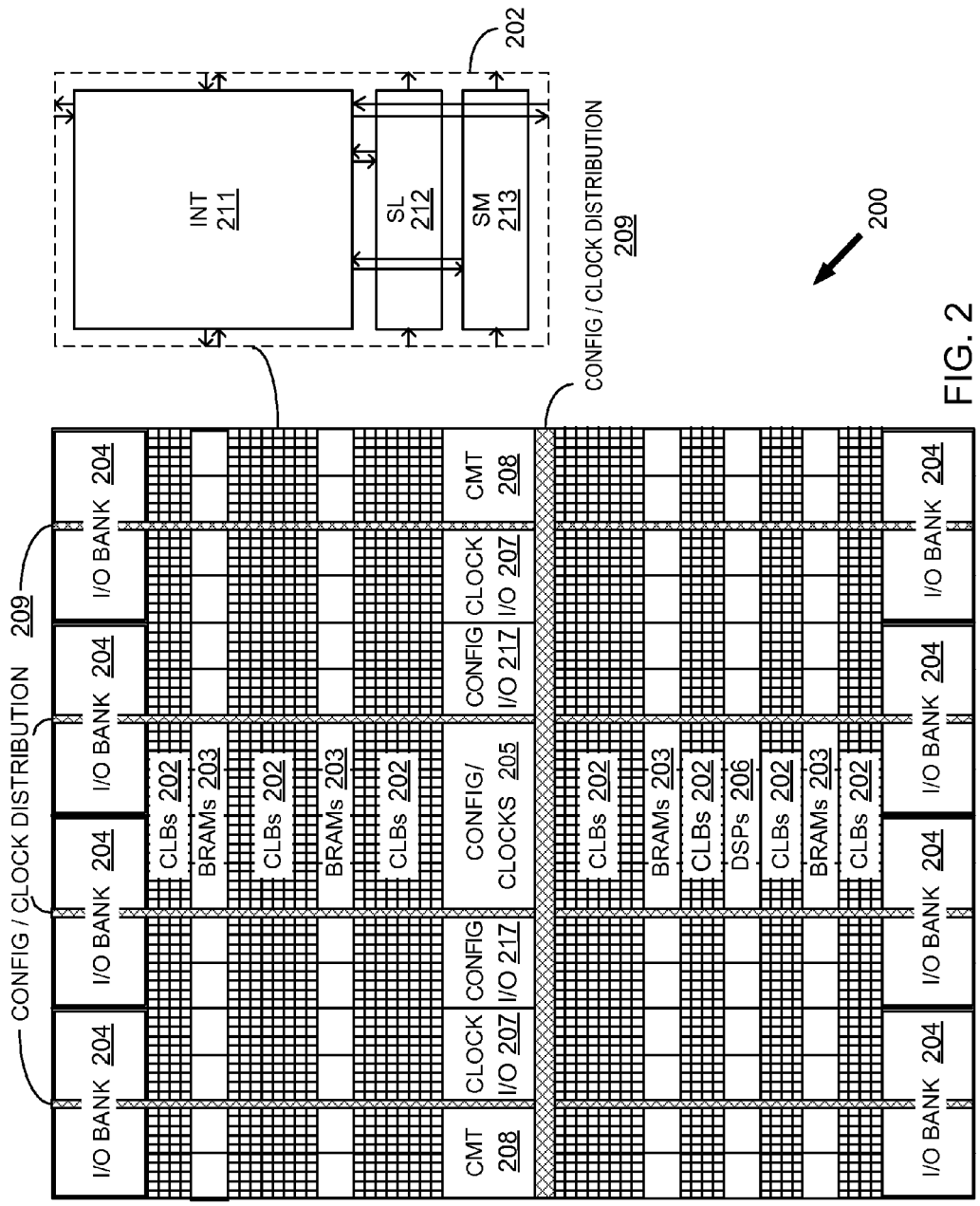
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
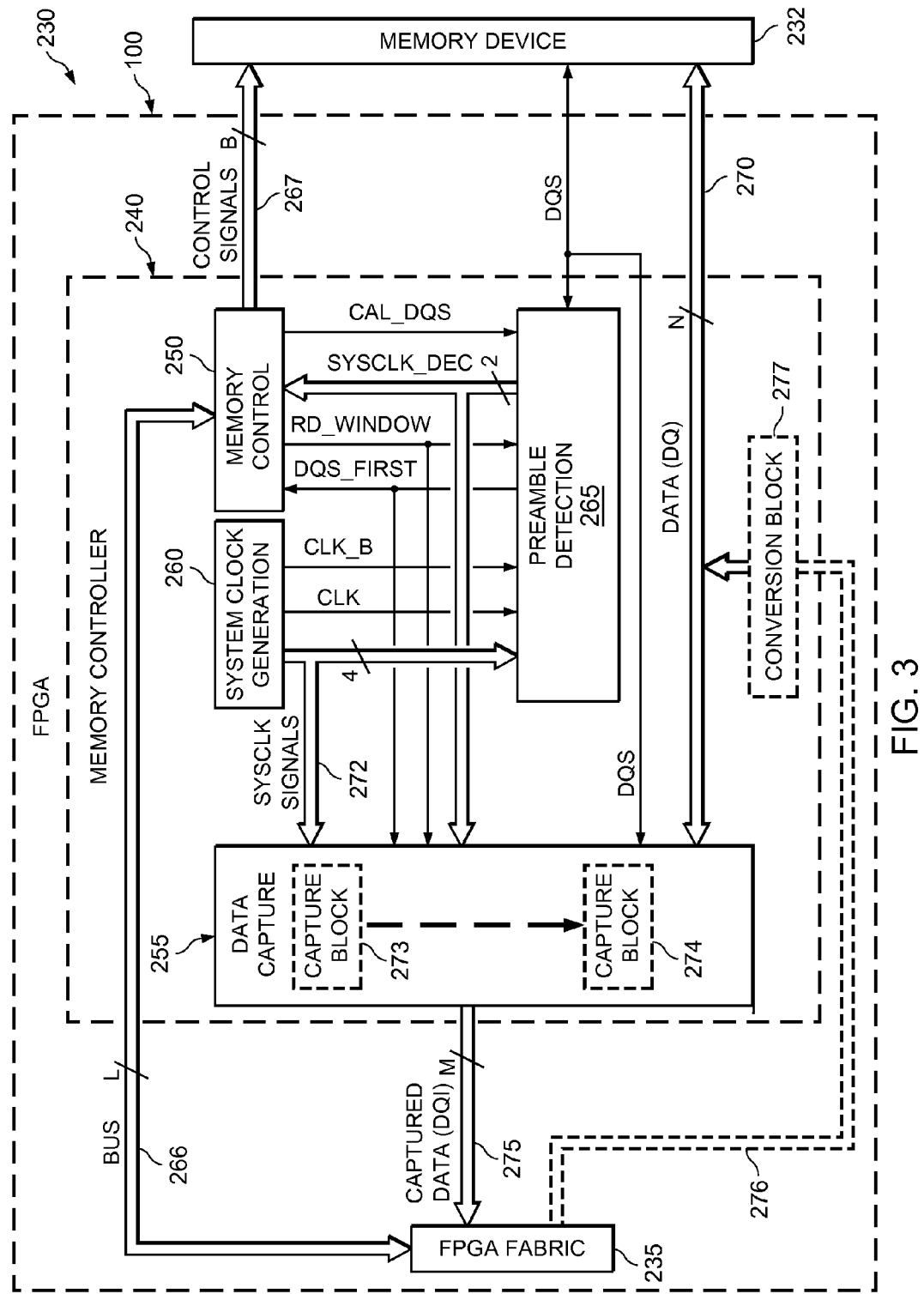
FIG. 3 is a high level block diagram showing an apparatus that includes a memory device and the FPGA architecture of FIG. 1.

FIG. 3 is a high level block diagram showing an apparatus 230 that includes a memory device 232 and the FPGA 100 of FIG. 1. The FPGA in FIG. 3 could alternatively be the FPGA 200 of FIG. 2. The FPGA 100 includes an FPGA fabric 235 and a memory controller 240. FIG. 3 does not show everything in the FPGA 100 and the memory controller 240. FIG. 3 shows only portions that are relevant to an understanding of the invention. The FPGA 100 communicates with the external memory device 232. The memory controller 240 coordinates the flow of information between the memory device 232 and the FPGA fabric 235. In the present embodiment, the memory controller 240 includes a memory control 250, a data capture 255, a system clock generation 260 and a preamble detection 265.

The system clock generation 260 generates clock signals that are internal to the FPGA 100, including four system clock signals 272 (SYSCLK_0, SYSCLK_90, SYSCLK_180 and SYSCLK_270), as well as high speed clock signals CLK and CLK_B. SYSCLK_0, SYSCLK_90, SYSCLK_180 and SYSCLK_270 have the same frequency but are separated in phase by 90 degrees, 180 degrees, and 270 degrees. CLK and CLK_B are clock signals having double the frequency of the SYSCLK signals 272, where CLK_B is the inverse of CLK. A signal name that ends in "_B" herein indicates that the signal name preceding the "_B" has its polarity reversed. For example, CLK_B is the inverse of CLK.

The FPGA fabric 235 is the core of the FPGA 100 and contains programmable tiles. When the FPGA fabric 235 needs to read from the memory device 232, the FPGA fabric 235 sends instructions to the memory control 250 via a bus 266, which has a number of lines L. The memory control 250 generates signals that include CAL_DQS and RD_WINDOW. RD_WINDOW is activated during a period of time when the FPGA 100 is performing a read operation from the memory device 232. CAL_DQS, which is discussed later and does not occur during normal operation, specifies a calibration period, during which an initial time delay between RD_WINDOW and a signal DQS (discussed below) is measured.

The memory control 250 sends control signals 267 to the memory device 232. The memory device 232 is a conventional memory device known in the art, conforming to a standard such as double data rate (DDR), DDR2, DDR3 or LPDDR (mobile DDR). However, it could alternatively be some other type of memory device. In the disclosed embodiment, the memory device 232 has a speed that can be as high as 800 MB/s. However, in place of the memory device 232, it would be possible to use a different memory device having a speed higher than 800 MB/s. In response to the control signals 267, the memory device 232 accesses data starting from a specified address, and outputs the data (DQ) at 270, which is incoming data to the memory controller 240. The data (DQ) 270 has a pin width N, which is the number of bits of data in a word, such as 4 bits, 8 bits or 16 bits. The incoming data (DQ) 270 is synchronized with the DQS signal that the memory device 232 outputs onto a tri-state line. The memory device 232 takes control of the tri-state line when it is ready to begin outputting data. DQS has rising and falling edges that indicate when the data (DQ) 270 being transmitted is valid and therefore should be accepted. The present embodiment employs a DDR scheme for the memory device 232, where both the rising and falling edges of DQS are used to indicate the validity of the data (DQ) 270. That is, the rising edge of DQS indicates that one valid word of data is present at 270, and the falling edge indicates that the next successive valid word of data is present at 270. Multiple pulses of DQS can occur within a read period, while RD_WINDOW is actuated.

The data (DQ) 270 is sent to the FPGA 100 and captured by data capture 255. The data capture 255 uses the system clock signals 272, which are not synchronized with DQS. To successfully capture the data (DQ) 270, the data (DQ) 270 needs to be transitioned from synchronization with DQS to synchronization with the system clock signals 272, without losing information in the process. This transition process involves detecting when the first rising edge of DQS occurs, which is handled by the preamble detection 265. A goal is to generate DQS_FIRST so that it occurs a very short time before DQS occurs. The preamble detection 265 receives DQS as an input and generates a signal DQS_FIRST that is essentially an estimation of when the first rising edge of DQS will occur. The preamble detection 265 also generates SYSCLK_DEC, which are two decoding signals that select one of the system clock signals 272 to function as a transitional clock signal for the data capture 255. These signals mentioned above as well as details of the preamble detection 265 will be discussed in detail later.

The data capture 255 has a plurality of capture blocks, two of which are shown at 273 and 274. Using DQS_FIRST and SYSCLK_DEC, each capture block in the data capture 255 captures two bits of the data (DQ) 270, and transitions these bits from synchronization with DQS to synchronization with the system clock signals 272, in a manner described in more detail later. This includes converting the incoming data from DDR data to SDR data. After capture, the data capture 255 outputs the captured data (DQI) at 275 to the FPGA fabric 235. The FPGA fabric 235 can also output data at 276. This data passes through a conversion block 277 that converts the outgoing data from SDR data to DDR data. The outgoing data is then routed at 270 to the memory device 232. Thus, the data flow at 270 between the memory device 232 and the FPGA 100 is bidirectional. The data path 276 and conversion block 277 are shown in broken lines in FIG. 3 because they are not necessary for an understanding of the embodiment of the present invention.

Figure 4:
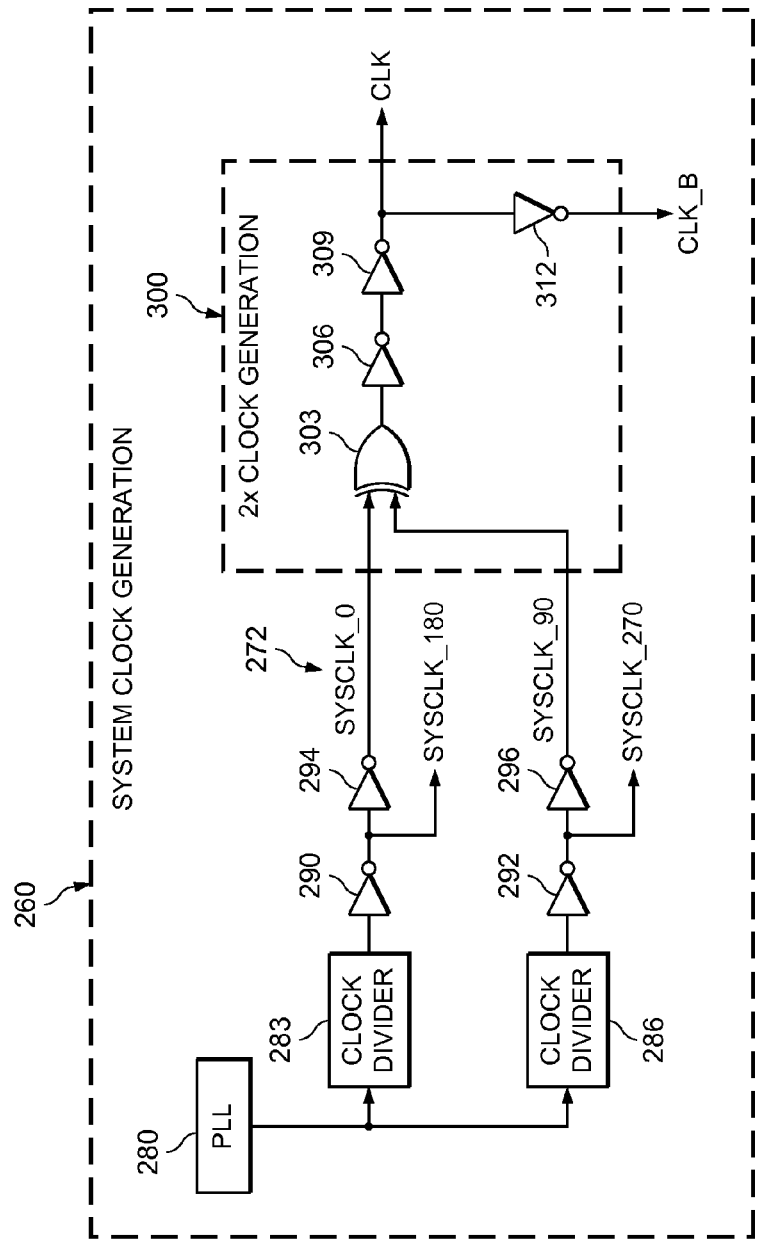
FIG. 4 is a circuit schematic of a system clock generation circuit within the FPGA architecture of FIG. 3.

FIG. 4 is a circuit schematic of the system clock generation 260. The system clock generation has a phase locked loop (PLL) 280, clock dividers 283 and 286, inverters 290, 292, 294 and 296, and a 2× clock generation 300. The PLL 280 provides a signal having a phase locked frequency that is based on a reference frequency, for example a reference frequency that is generated by a crystal. Thus, the signal provided by the PLL is very stable and is suitable for generating clock signals. The output of the PLL 280 is coupled to the input of clock dividers 283 and 286, whose outputs are coupled to the inputs of inverters 290 and 292, respectively. The clock dividers 283 and 286 receive the PLL signal and produce signals that have frequencies that are integer divisions of the frequency of the PLL signal. The outputs of the inverters 290 and 292 are respectively coupled to the inputs of the inverters 294 and 296. The outputs of the inverters 294 and 296 are coupled to the 2× clock generation 300. The signals outputted by the clock dividers 283 and 286 are inverted by the inverters 290 and 292, respectively, so as to produce SYSCLK_180 and SYSCLK_270, respectively. SYSCLK_180 and SYSCLK_270 are inverted again by the inverters 294 and 296, respectively, so as to produce SYSCLK_0 and SYSCLK_90, respectively. The inverters 294 and 296 are sized according to load in order to reduce skew.

SYSCLK_0 and SYSCLK_90 are sent to 2× clock generation 300. The 2× clock generation 300 has an exclusive OR (XOR) gate 303 and inverters 306, 309 and 312. The XOR gate 303 has two inputs that receive SYSCLK_0 and SYSCLK_90 and an output that is coupled to the input of the inverter 306. The output of the inverter 306 is coupled to the input of the inverter 309, and the output of the inverter 309 is coupled to the input of the inverter 312. Here, the operation of the XOR gate generates the clock signal CLK having a frequency that is double the frequencies of system clock signals SYSCLK_0 and SYSCLK_90. Therefore, the output of the inverter 309 is CLK, which is a 2× clock signal having a frequency that is twice the frequency of the system clock signals 272. CLK is inverted again by the inverter 312 to produce CLK_B, which is the inverse of CLK, as mentioned above.

Figure 5:
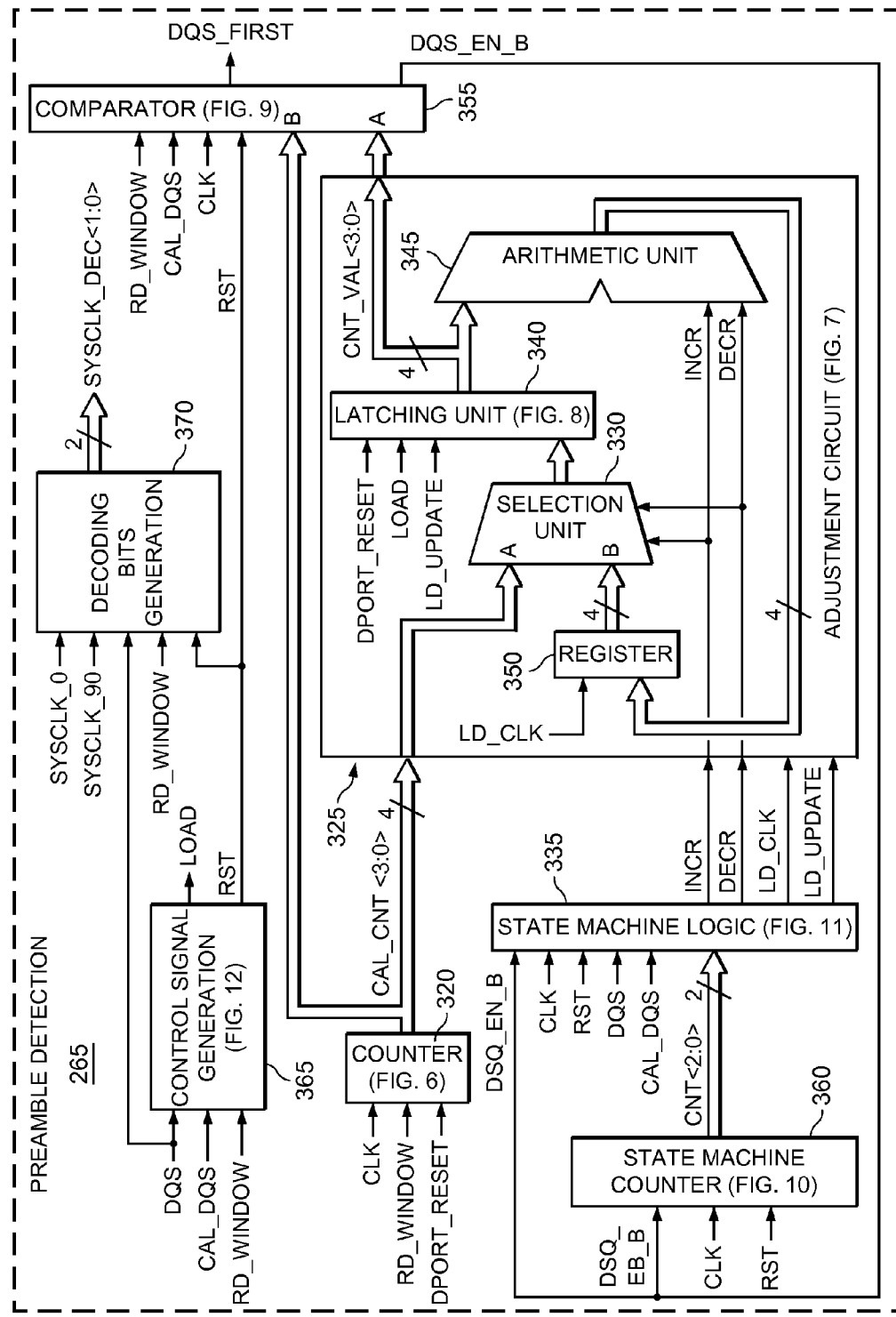
FIG. 5 is a block diagram of a preamble detection circuit within the FPGA architecture of FIG. 3.

FIG. 5 is a block diagram of the preamble detection 265 of FIG. 3. The preamble detection 265 includes a counter 320 having CLK as a clock input and DPORT_RESET and RD_WINDOW as reset inputs. DPORT_RESET is a global reset signal that is used to reset many circuit components, for example during an initial power-up. After resetting the circuit components, DPORT_RESET is de-actuated. The counter 320 is a 4-bit non-ripple counter, which means the 4 output bits of the counter all change approximately simultaneously. Until RD_WINDOW is actuated, the counter 320 remains at the reset state of binary 0000 and does not count. When RD_WINDOW is actuated, the counter 320 begins sequentially counting up from binary 0000. Consequently, the counter 320 generates a 4-bit data output CAL_CNT<3:0> that is a present value of the counter. When RD_WINDOW is de-actuated, the counter 320 is reset to binary 0000. In an alternative embodiment, the counter 320 may be implemented as a Gray code counter rather than a binary counter. As known in the art, each time a Gray code counter changes from one state to the next, only one bit changes. This reduces the possibility of a race condition and/or an undesired glitch in circuitry coupled to the output of the counter.

In FIG. 5, an input of an adjustment circuit 325 is coupled to the data output CAL_CNT<3:0> of the counter 320. The adjustment circuit 325 has a 2-to-1 selection unit 330 that has a data input A coupled to the data output CAL_CNT<3:0> of the counter 320 and a data input B coupled to another signal (to be discussed later). The selection unit 330 also receives INCR and DECR signals as control inputs. INCR and DECR are generated by a state machine logic 335 that will be discussed shortly. If neither INCR nor DECR is high, the selection unit 330 routes the data input A to its data output. If either INCR or DECR is high, the selection unit 330 routes the data input B to its data output.

The adjustment circuit 325 includes a latching unit 340 having a data input that is coupled to the data output of the selection unit 330. The latching unit 340 also receives DPORT_RESET as a reset input and LOAD and LD_UPDATE signals as load control inputs. LOAD and LD_UPDATE are generated by other blocks of the preamble detection 265 and will be discussed shortly. The data output of the selection unit 330 is accepted and latched into the latching unit 340 in response to either LOAD or LD_UPDATE. The latching unit 340 can be reset by DPORT_RESET, in which case the latch is initialized with a predetermined default value of binary 0010 instead of the data output of the selection unit 330. The data output of the latching unit 340 is its latched value, which is denoted as CNT_VAL<3:0>.

The adjustment circuit 325 also includes an arithmetic unit 345 having a data input that is coupled to the data output CNT_VAL<3:0> of the latching unit 340. The arithmetic unit 345 also receives the INCR and DECR signals as control inputs. When INCR is high and DECR is low, the arithmetic unit 345 generates a data output that is an incremented value of its data input. When DECR is high and INCR is low, the arithmetic unit 345 generates a data output that is a decremented value of its data input. When neither DECR nor INCR is high, the arithmetic unit 345 generates a data output equal to its data input.

The adjustment circuit 325 includes a register 350. The data output of the arithmetic unit 345 is sent to a data input of the register 350 to be stored therein. The register 350 is loaded by LD_CLK, which is another control signal generated by other blocks of the preamble detection, and discussed later. The data output of the register 350 is coupled to the data input B of the selection unit 330.

The preamble detection 265 includes a comparator 355 that has a data input A coupled to the data output CNT_VAL<3:0> of the latching unit 340. The comparator 355 also has a data input B that is coupled to the data output CAL_CNT<3:0> of the counter 320. The comparator 355 continuously compares the data inputs A and B. When the comparison shows the inputs are equal, the comparator 355 sets an output DQS_FIRST to be high. The comparator 355 also includes an enable circuit (not visible in FIG. 5) that receives RD_WINDOW and CAL_DQS as control inputs, CLK as a clock input, and RST as a reset input. RST is a reset signal used to reset various circuits in the preamble detection. RST is generated by another block of the preamble detection that will be discussed shortly. In response to CAL_DQS and RD_WINDOW, the enable circuit of the comparator 355 either enables or disables the generation of a feedback signal DQS_EN_B that is related to DQS_FIRST, as discussed in more detail later.

The preamble detection 265 also includes a 3-bit non-ripple state machine counter 360. The state machine counter 360 has a count enable input that is coupled to DQS_EN_B, a clock input that is coupled to CLK, and a reset input that is coupled to RST. When enabled by DQS_EN_B, the state machine counter 360 counts up sequentially from binary 000 to binary 111 and produces these count values as its output CNT<2:0>. The counter 320 stops at binary 111, and is eventually reset back to binary 000 by the RST signal. The state machine counter 360 controls the operation of the state machine logic 335.

The state machine logic 335 receives CLK as a clock input, RST as a reset input, DQS as a data input, and DQS_EN_B, CAL_DQS and the output CNT<2:0> of the state machine counter 360 as control inputs. The output CNT<2:0> of the state machine counter 360 defines various states of the state machine logic 335. States 0 and 1 of the state machine logic 335 correspond to the output CNT<2:0> of the state machine counter 360 being binary 000 and 001, respectively, and states 2, 3, 4 and 5 of the state machine logic 335 correspond to the output CNT<2:0> of the state machine counter 360 being binary 010, 011, 100 and 101, respectively. During states 0 and 1, a sampling circuit (not visible in FIG. 5) in the state machine logic 335 captures the state of DQS at various different points in time, as discussed in more detail later. Based on the captured states of DQS, the state machine logic 335 may set either INCR or DECR to be high during states 2, 3, 4, and 5, or may keep both INCR and DECR low during states 2-5. As mentioned above, INCR and DECR are sent to the arithmetic unit 345 and the selection unit 330 of the adjustment circuit 325. As discussed in more detail later, the state machine logic 335 also generates the control signals LD_CLK and LD_UPDATE, which are used to control the register 350 and the latching unit 340, as mentioned above.

The preamble detection 265 also includes a control signal generation 365 that receives DQS, CAL_DQS and RD_WINDOW as control inputs and generates LOAD and RST as load and reset outputs, respectively. As mentioned before, LOAD is one of two signals that can each cause the latching unit 340 in the adjustment circuit 325 to accept and latch data. The control signal generation 365 is discussed in more detail later.

The preamble detection 265 further includes a decoding bits generation 370. The decoding bits generation 370 has data inputs that are coupled to SYSCLKO and SYSCLK_90, a control input that is coupled to RD_WINDOW, and a reset input that is coupled to RST. In response to SYSCLK_0, SYSLCK_90 and RD_WINDOW, the decoding bits generation 370 generates a 2-bit decoding signal, SYSCLK_DEC<1:0>, in a manner discussed in more detail later. As mentioned above in the description associated with FIG. 4, SYSCLK_DEC<1:0> is used to select one of the four system clock signals (SYSCLK_0, SYSCLK_90, SYSCLK_180 and SYSCLK_270) to be the transitional clock signal, the details of which will be discussed later.

Since the memory device 232 and the FPGA 100 are asynchronous, whenever the FPGA 100 wants to read data from the memory device 232, the FPGA 100 needs to know when the memory device 232 is outputting valid data. The purpose of generating DQS_FIRST is to let certain sections of the memory controller 240 know when to read the data transmitted by the memory device 232. To accomplish this, it is important to determine the time delay between a time when RD_WINDOW is actuated by the memory controller 240, which signals the beginning of a memory read cycle, and a time when the first rising edge of DQS occurs under the control of the memory device 232, which signals that the memory device 232 is now outputting valid data. A fairly accurate measurement of the initial time delay between RD_WINDOW and DQS is obtained by calibration. This measurement of the initial time delay is then saved in the latching unit 340 and used in subsequent memory read cycles as an estimate of the time delay between RD_WINDOW and DQS. This estimate is fairly accurate, because it can be presumed that the time delay between RD_WINDOW and DQS in subsequent memory read cycles does not deviate too much from the initial time delay measured between these signals during calibration. Calibration does not automatically occur during each memory cycle. If the FPGA fabric 235 wants calibration to be performed, it requests a calibration operation. If calibration is not performed, a default estimate of the time delay between RD_WINDOW and DQS is provided by the latching unit 340, which as discussed above is initialized to the default binary value of 0010 by DPORT_RESET.

Thus, the preamble detection 265 essentially has two modes of operation: a calibration mode and a normal mode. The calibration mode is initiated by starting a memory read cycle and setting CAL_DQS high. During the calibration mode, the counter 320 starts counting from binary 0000 when RD_WINDOW goes high. In the calibration mode, neither INCR nor DECR is actuated, and so the output of the counter 320 is always selected by the selection unit 330 during the calibration mode and is outputted to the latching unit 340. The LOAD signal is generated by the control signal generation 365 when RD_WINDOW goes high during calibration. Thus, the latching unit is enabled and becomes transparent and accepts the output of the counter 320. The first time DQS goes high after RD_WINDOW goes high, the LOAD signal is de-actuated. At this time, the latching unit 340 latches the present value of the counter 320 at the time that DQS goes high. Therefore, the counter 320 measures an initial time delay during a calibration period between the assertion of RD_WINDOW and the leading edge of the first pulse of DQS. The value latched into the latching unit 340 during calibration represents this initial time delay.

The preamble detection 265 operates in its normal mode of operation when a memory read cycle is started and CAL_DQS remains low. When RD_WINDOW goes high, the counter 320 begins sequentially counting up from binary 0000, and the value in the counter 320 indicates an amount of time elapsed since RD_WINDOW occurred. Each data output of the counter 320 is sent to the comparator 355 to be compared with the value latched into the latching unit 340. When these two values are eventually found to be equal, the amount of time elapsed is equal to the estimated time delay defined by the value in the latching unit 340. This is a point in time where DQS is estimated to occur.

Consequently, the comparator 355 generates DQS_FIRST and DQS_EN_B at this point in time. DQS_EN_B is then fed back to the state machine counter 360 and the state machine logic 335. When DQS_EN_B is not actuated, the sampling circuit in the state machine remains in a state of reset, and the state machine counter 360 is prevented from counting. When DQS_EN_B is actuated, the state machine counter 360 begins counting, and the sampling circuit in the state machine is no longer held in reset and begins sampling DQS.

DQS is sampled four times to produce a 4-bit sampling pattern. Based on the sampling pattern, the state machine logic 335 makes a determination as to whether the actual DQS signal occurred before or after DQS_FIRST. If the state machine logic 335 determines that the actual DQS signal occurred before DQS_FIRST, or almost immediately after DQS, then the estimate of the time delay between RD_WINDOW and DQS is too long and needs to be shortened. That is, the value in the latching unit 340 needs to be decreased. The state machine logic 335 then actuates the DECR signal to cause the decrease. Conversely, if the state machine logic 335 determines that the actual DQS signal occurred too long after DQS_FIRST, then the estimate of the time delay between RD_WINDOW and DQS is too short and needs to be lengthened. That is, the value in the latching unit 340 needs to be increased. The state machine logic 335 then actuates the INCR signal to cause the increase. If the state machine logic 335 determines that the actual DQS signal occurred approximately at the same time as DQS_FIRST or shortly thereafter, no change needs to be made to the estimate in the latching unit 340 of the time delay between RD_WINDOW and DQS, and the state machine logic 335 does not actuate either the INCR signal or the DECR signal.

As mentioned above, the arithmetic unit 345 is controlled by the INCR and DECR signals. The arithmetic unit 345 increments the value from the latching unit 340 when INCR is actuated but DECR is not actuated. The arithmetic unit 345 decrements the value from the latching unit 340 when DECR is actuated but INCR is not actuated. The arithmetic unit 345 does not change the value from the latching unit 340 when neither INCR nor DECR is actuated. The output of the arithmetic unit 345 is sent to the register 350. When LD_CLK is actuated, the output of the arithmetic unit 345 is loaded into the register 350.

As mentioned previously, the selection unit 330 also receives INCR and DECR as control signals. When either INCR or DECR has been actuated, the initial estimate of time delay between RD_WINDOW and DQS needs to be changed. Thus, the selection unit 330 selects the data input B, which is the value stored in the register 350, to be outputted to the latching unit 340. When either INCR or DECR is actuated, LD_UPDATE is actuated, which makes the latching unit 340 transparent so that it accepts the output of the selection unit 330, which will be latched into the latching unit when LD_UPDATE eventually goes low. When neither INCR nor DECR is actuated, the estimate of the time delay between RD_WINDOW and DQS is accurate and need not be changed. The selection unit 330 will select the data input A, which is the output CAL_CNT<3:0> of the counter 320, to be routed to the latching unit 340. However, LD_UPDATE is not actuated unless either INCR or DECR is actuated. Thus, the latching unit 340 does not accept and save the output of the selection unit 330. Rather, the latching unit 340 keeps the same value latched therein without change.

The above describes a calibration operation (which is optional) and one normal memory read cycle. RD_WINDOW is actuated in both the calibration operation and the normal memory read cycle. At the completion of each of the calibration operation and the memory read cycle, RD_WINDOW is de-actuated. The value latched into the latching unit 340 of the adjustment circuit 325 is not lost when RD_WIN- DOW is de-actuated. For a subsequent normal memory read cycle, RD_WINDOW is actuated again. The preamble detection then uses the value currently latched into the latching unit 340 to provide an estimate of the time delay between RD_WINDOW and DQS.

Figure 6:
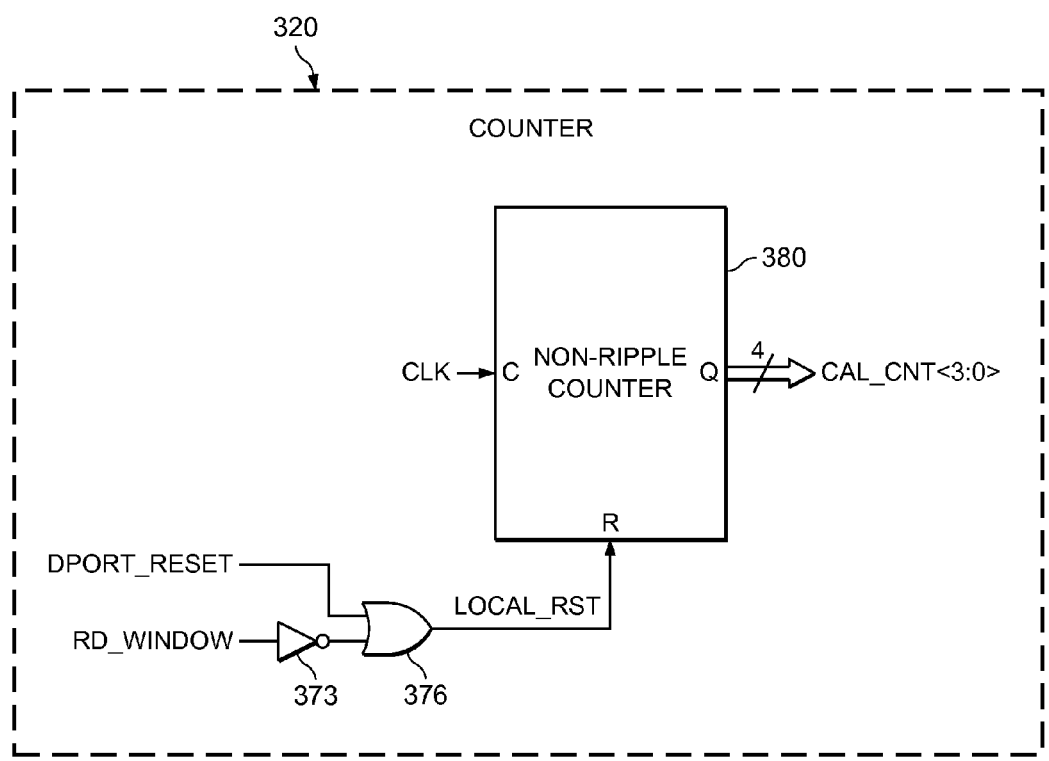
FIGS. 6-12 are circuit schematics of various sections of the preamble detection circuit of FIG. 5.

The circuitries of the various blocks in FIG. 5 will now be described in more detail. FIG. 6 is a circuit schematic of the counter 320 of FIG. 5. The counter 320 has an inverter 373, an OR gate 376 and a non-ripple counter 380. The inverter 373 has an input that is coupled to the signal RD_WINDOW. The OR gate 376 has two inputs that are coupled to the signal DPORT_RESET and an output of the inverter 373, respectively. The OR gate 376 outputs a local reset signal LOCAL_RST. The non-ripple counter 380 has a reset input R that is coupled to LOCAL_RST and a clock input C that is coupled to the signal CLK. The non-ripple counter 380 produces the O-bit binary output CAL_CNT<3:0>.

When DPORT_RESET is high or when RD_WINDOW is low, LOCAL_RST is actuated, and the counter 380 is reset, in which case the output CAL_CNT<3:0> of the counter is held at binary 0000. However, during a normal memory read, when DPORT_RESET is low and RD_WINDOW is high, LOCAL_RST is de-actuated, and the counter 380 is no longer held in reset and begins counting clock pulses of CLK. The output CAL_CNT<3:0> of the counter 380 counts sequentially up from 0000.

Figure 7:
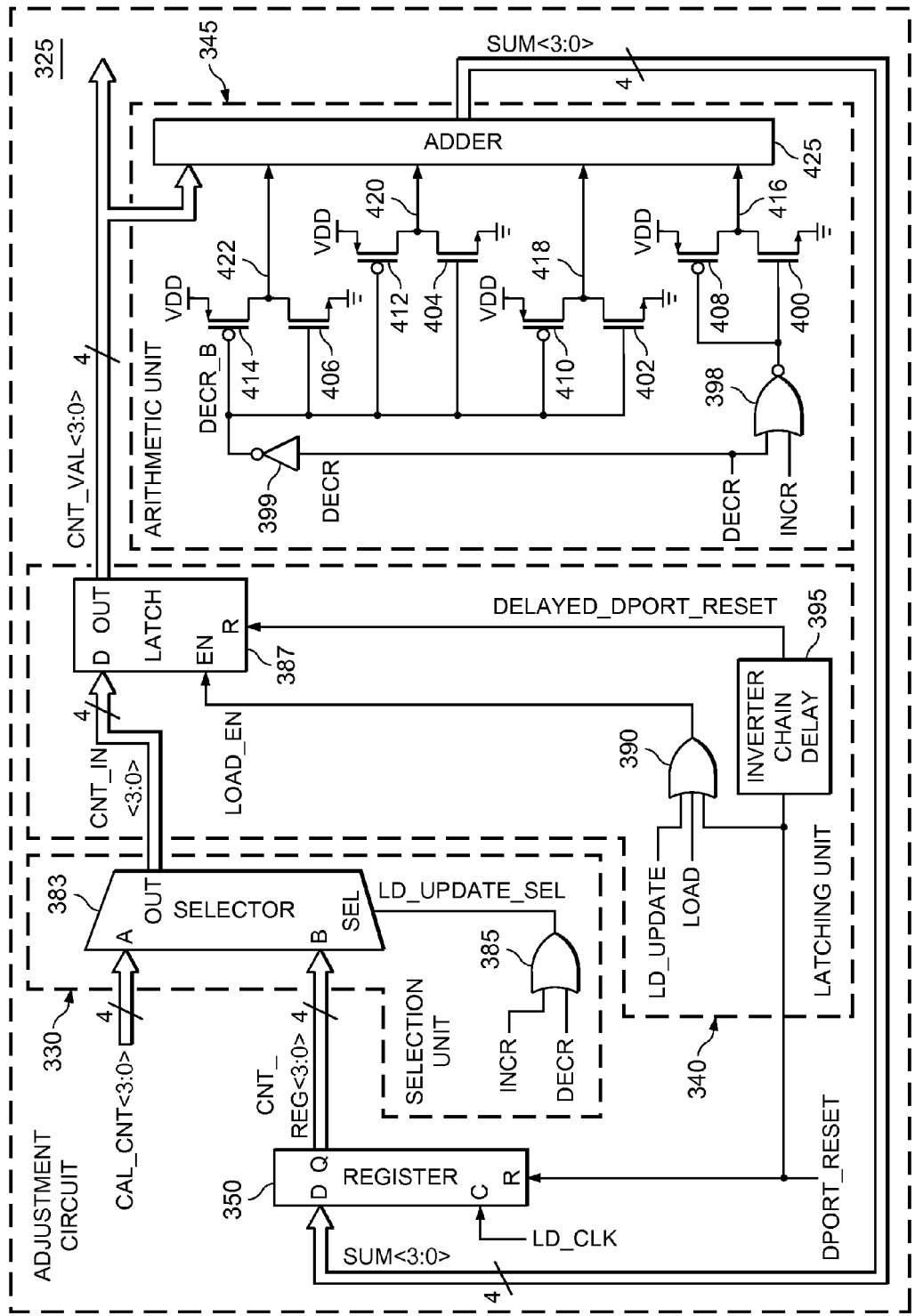

FIG. 7 is a circuit schematic showing the adjustment circuit 325 of FIG. 5 in more detail. The discussion below of FIG. 7 focuses primarily on the additional detail that is not shown in FIG. 5. The selection unit 330 includes a selector 383 and a 2-input OR gate 385. The OR gate 385 receives the control signals INCR and DECR as inputs. The OR gate has an output that is coupled to a control input SEL of the selector 383. The selector 383 also has two data inputs A and B that correspond to the data inputs A and B, respectively, of the selection unit 330 of FIG. 5. Thus, the data input A is coupled to the output CAL_CNT<3:0> of the counter 380 (FIG. 6), and the data input B is coupled to a 4-bit binary signal CNT_REG<3:0> that will be discussed later. The selector 383 has a data output OUT that corresponds to the data output of the selection unit 330 of FIG. 5. The data output OUT is a 4-bit binary signal CNT_IN<3:0>.

The latching unit 340 includes a 4-bit latch 387, a 3-input OR gate 390 and an inverter chain delay 395. The OR gate 390 receives the signals LD_UPDATE, LOAD and DPORT_RESET as inputs and outputs a control signal LOAD_EN. The LOAD_EN signal is received by an enable input EN of the latch 387. The inverter chain delay receives DPORT_RESET as an input and outputs a delayed reset signal DELAYED_DPORT_RESET to a reset input R of the latch 387. The latch 387 has a data input D that corresponds to the data input of the latching unit 340 of FIG. 5. Thus, the data output CNT_IN<3:0> of the selector 383 is received by the data input D of the latch 387.

The latch 387 has a data output OUT that outputs a 4-bit binary signal CNT_VAL<3:0> as a data input to the arithmetic unit 345. The arithmetic unit 345 has a NOR gate 398 that receives DECR and INCR as inputs. The DECR signal is an input to an inverter 399, which produces an output DECR_B. The arithmetic unit 345 also has NMOS transistors 400, 402, 404 and 406 and PMOS transistors 408, 410, 412 and 414. The gates of the transistors 400 and 408 are coupled to an output of the NOR gate 398, and the gates of the transistors 402, 404, 406, 410, 412 and 414 are coupled to the output DECR_B of the inverter 399. The source of each of the NMOS transistors 400, 402, 404 and 406 is coupled to ground. The source of each of the PMOS transistors 408, 410, 412 and 414 is coupled to a power supply VDD. The drain of the NMOS transistor 400 is coupled to the drain of the PMOS transistor 408 to form an output node 416, the drain of the NMOS transistor 402 is coupled to the drain of the PMOS transistor 410 to form an output node 418, the drain of the NMOS transistor 404 is coupled to the drain of the PMOS transistor 412 to form an output node 420, and the drain of the NMOS transistor 406 is coupled to the drain of the PMOS transistor 414 to form an output node 422.

The output nodes 416, 418, 420 and 422 are coupled to one data input of an adder 425, where the node 416 is the least significant bit (LSB). The adder 425 also receives the output CNT_VAL<3:0> of the latch 387 as another data input. An output of the adder 425 corresponds to the output of the arithmetic unit 345 of FIG. 5. Thus, the adder 425 outputs a 4-bit binary signal SUM<3:0> to a data input D of the register 350. The register 350 also has a clock input C that receives the control signal LD_CLK (FIG. 5) and a reset R that receives DPORT_RESET. The register 350 has an output Q that outputs the 4-bit binary signal CNT_REG<3:0> mentioned above.

The selector 383 is controlled by the signal LD_UPDATE_SEL. When LD_UPDATE_SEL is low, which occurs when both INCR and DECR are low, the selector 383 selects and outputs the input signal CAL_CNT<3:0> at the data port A. When LD_UPDATE_SEL is high, which occurs when either INCR or DECR is high, the selector 383 selects and outputs the input signal CNT_REG<3:0> at the data port B.

The latch 387 is enabled (or turned on) when LOAD_EN is high, which occurs when either LD_UPDATE, LOAD or DPORT_RESET is high. When LOAD_EN goes high, the latch 387 becomes transparent and passes the input signal at the data input D. When LOAD_EN goes low, the latch 387 latches the value of the input signal at the data input D at that time. The latch 387 is reset by the signal DELAYED_DPORT_RESET, which means the latch will be forced to a predetermined binary value of 0010 as discussed earlier in association with FIG. 5. The internal circuitry of the latch 387 will be discussed in more detail later.

The transistors 400, 402, 404, 406, 408, 410, 412 and 414 of the arithmetic unit supply numbers in two's complement form to the adder 425. When INCR is high and DECR is low, the output of the NOR gate 398 is low, which causes the NMOS transistor 400 to turn off and the PMOS transistor 408 to turn on. Thus, the node 416 is pulled up to VDD and supplies a logic high signal to the adder 425. At the same time, since DECR is low, its inverse DECR_B is high, which causes the PMOS transistors 410, 412 and 414 to turn off and the NMOS transistors 402, 404 and 406 to turn on. Thus, the nodes 418, 420 and 422 are pulled to ground and each supply a logic low signal to the adder 425. In other words, the adder receives a value of binary 0001. When DECR is high and INCR is low, the output of the NOR gate 398 is low, which means that the node 416 still supplies a logic high signal to the adder 425. At the same time, DECR_B is low, which causes the PMOS transistors 410, 412 and 414 to turn on and the NMOS transistors 402, 404 and 406 to turn off. Thus, the nodes 418, 420 and 422 are pulled to VDD and each supply a logic high signal to the adder 425. In other words, the adder receives a value of binary 1111, which is a negative 1 in two's complement form. When INCR and DECR are both low, the output of the NOR gate 398 is high, which means the node 416 is pulled to ground and supplies a logic low signal to the adder 425. At the same time, since DECR is low, its inverse DECR_B is high, which causes the PMOS transistors 410, 412 and 414 to turn off and the NMOS transistors 402, 404 and 406 to turn on. Thus, the nodes 418, 420 and 422 are pulled to ground and each supply a logic low signal to the adder 425. In other words, the adder receives a value of binary 0000.

The adder 425 takes the output CNT_VAL<3:0> of the latch 387 as a data input, and adds to it the value received from transistors 400, 402, 404, 406, 408, 410, 412 and 414. Thus, the adder 425 increments the data from the latch 387 when INCR is high, decrements the data from the latch 387 when DECR is high, or does not change the data from the latch 387 when neither INCR nor DECR is high. The adder then outputs SUM<3:0> to the register 350. The register 350 will store the signal SUM<3:0> when LD_CLK goes high.

Figure 8:
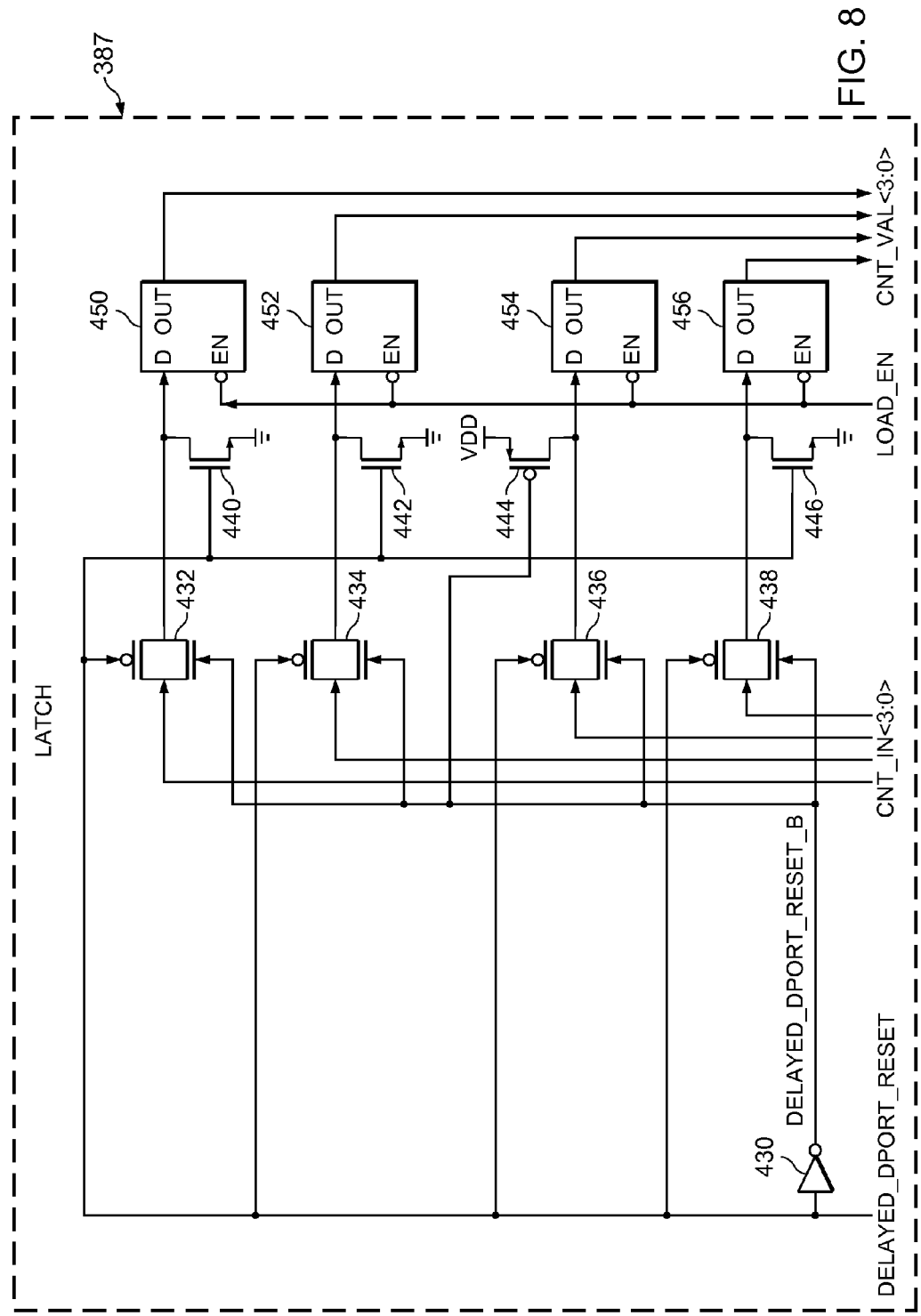

FIG. 8 is a circuit schematic showing the latch 387 of FIG. 7 in more detail. The delayed reset signal DELAYED_DPORT_RESET is inverted by an inverter 430 to produce DELAYED_DPORT_RESET_B. Four transmission gates 432, 434, 436 and 438 each have two control inputs that are respectively coupled to the signals DELAYED_DEPORT_RESET and DPORT_RESET_B. The transmission gates 432, 434, 436 and 438 each receive one bit of the signal CNT_IN<3:0> as a data input, with the transmission gate 432 receiving the LSB and the transmission gate 438 receiving the most significant bit (MSB).

An NMOS transistor 440, an NMOS transistor 442, a PMOS transistor 444 and an NMOS transistor 446 have drains that are respectively coupled to the data outputs of the transmission gates 432, 434, 436 and 438. The sources of the NMOS transistors 440, 442 and 446 are coupled to ground, and the source of the PMOS transistor 444 is coupled to VDD. The gates of the NMOS transistors 440, 442 and 446 are coupled to DELAYED_DPORT_RESET, and the gate of the PMOS transistor 444 is coupled to DELAYED_DPORT_RESET_B.

Four latches 450, 452, 454 and 456 have data inputs D that are respectively coupled to the data outputs of the transmission gates 432, 434, 436 and 438. The latches 450, 452, 454 and 456 each have an enable input EN coupled to the control signal LOAD_EN. The latches 450, 452, 454 and 456 each output a bit of the signal CNT_VAL<3:0>, with the latch 450 outputting the LSB, and the latch 456 outputting the MSB.

The signals DELAYED_DPORT_RESET and DELAYED_DPORT_RESET_B control whether the transmission gates 432, 434, 436 and 438 are turned on or off. When DELAYED_DPORT_RESET is high, the transmission gates 432, 434, 436 and 438 are all turned off. Meanwhile, the NMOS transistors 440, 442 and 446 are turned on and pulled to ground, and the PMOS transistor 444 is turned on and pulled to VDD. In other words, the latches 450, 452, 454 and 456 together receive a value of binary 0010. Hence, every time the latch 387 is reset, it is initialized to the value of binary 0010. When DELAYED_DPORT_RESET is low, the transmission gates 432, 434, 436 and 438 are all turned on, which means these transmission gates freely pass the input signals (CNT_IN<3:0>) to their outputs. Meanwhile, the NMOS transistors 440, 442 and 446 as well as the PMOS transistor 444 are all turned off and act as open circuits. Therefore, the latches 450, 452, 454 and 456 receive the signal CNT_IN<3:0>. When LOAD_EN goes high, the latches 450, 452, 454 and 456 become transparent and pass the signal CNT_IN<3:0> to the outputs OUT. When LOAD_EN goes low, the values in the latches 450, 452, 454 and 456 are latched.

Figure 9:
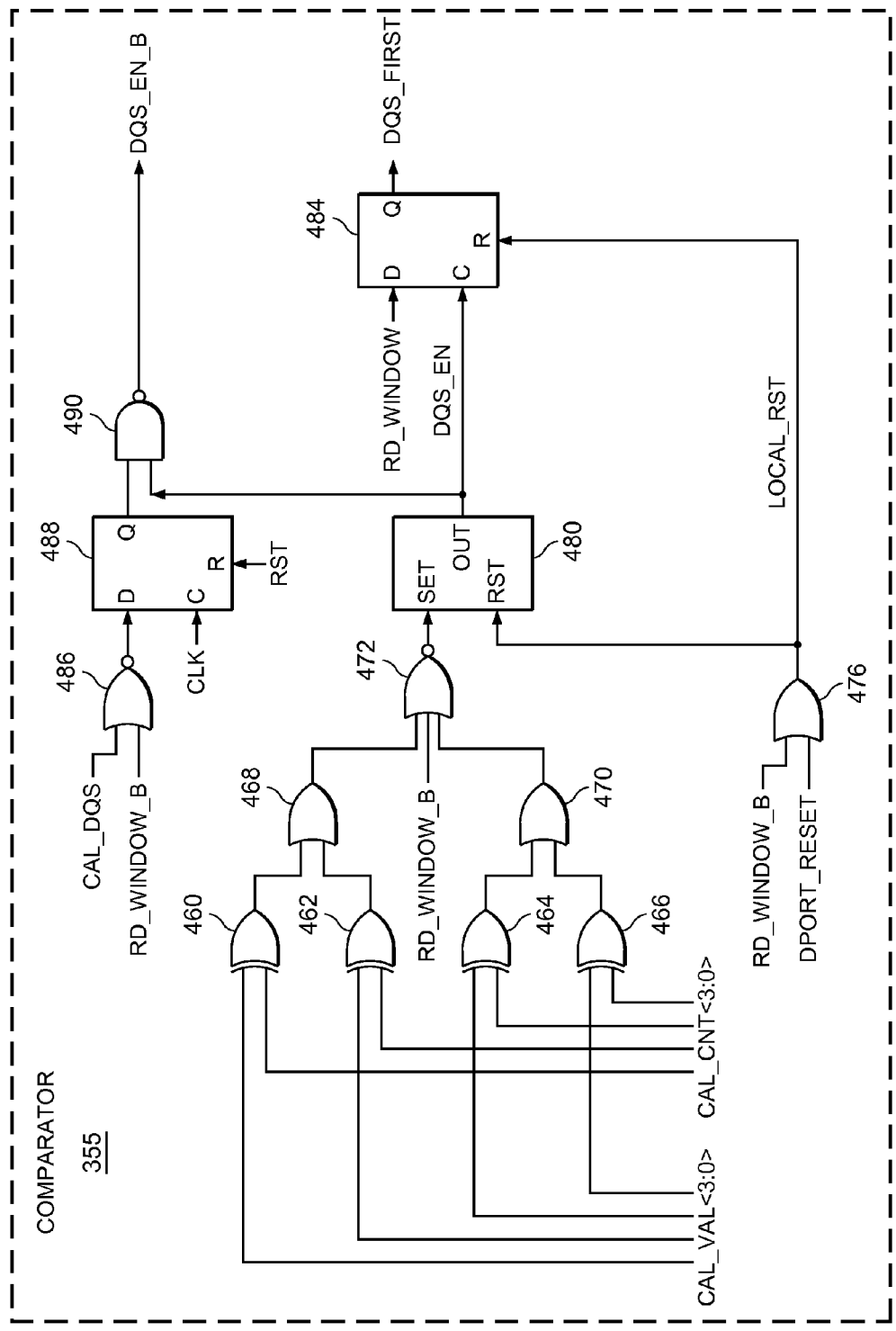

FIG. 9 is a circuit schematic showing the comparator 355 of FIG. 5 in more detail. The discussion below of FIG. 9 focuses primarily on the additional detail that is not shown in FIG. 5. Four 2-input exclusive OR (XOR) gates 460, 462, 464 and 466 each have a first input coupled to a respective bit of the signal CNT_VAL<3:0> and a second input coupled to a respective bit of the signal CAL_CNT<3:0>. Two 2-input OR gates 468 and 470 each have two inputs that are coupled to the outputs of the XOR gates 460 and 462, and XOR gates 464 and 466, respectively. A 3-input NOR gate 472 has two inputs coupled to the outputs of the XOR gates 468 and 470 and a further input coupled to RD_WINDOW_B.

A 2-input OR gate 476 has first and second inputs coupled to the signals RD_WINDOW_B and DPORT_RESET, and outputs a local reset signal LOCAL_RST. A set-reset (SR) latch 480 has a set input SET that is coupled to the output of the NOR gate 472 and a reset input RST that is coupled to the output of the OR gate 476. The SR latch 480 outputs a signal DQS_EN. In an alternative embodiment, the SR latch 480 could be replaced with a D-flip flop having a synchronous reset, and having its clock input coupled to the 2× clock signal CLK.

In FIG. 9, a D-flip flop 484 has a data input D that is coupled to the signal RD_WINDOW, a clock input C that is coupled to DQS_EN from the output of the latch 480, and a reset input R that is coupled to LOCAL_RST from the output of the gate 476. The D-flip flop 484 has an output Q that outputs the signal DQS_FIRST.

A 2-input NOR gate 486 has one input coupled to CAL_DQS and a further input coupled to RD_WINDOW_B. A D-flip flop 488 has a data input D that is coupled to the output of the NOR gate 486, a clock input C that is coupled to the signal CLK, and a reset input R that is coupled to the signal RST. The D-flip flop 488 has an output Q. A 2-input NAND gate 490 has one input that is coupled to the output Q of the D-flip flop 488 and a further input that is coupled to DQS_EN. The NAND gate 490 outputs the signal DQS_EN_B.

When DPORT_RESET is high, the output LOCAL_RST of the OR gate 476 is high, which causes the SR latch 480 and the D-flip flop 484 to reset. Later, during calibration, RD_WINDOW is low and RD_WINDOW_B is high. Thus, the output LOCAL_RST of the OR gate 476 is high and keeps the SR latch 480 and the D-flip flop 484 reset. During a memory read cycle, RD_WINDOW is high and RD_WINDOW_B is low, and DPORT_RESET is low as well. Hence, the output LOCAL_RST of the OR gate 476 is low, and neither the SR latch 480 nor the D-flip flop 484 is reset.

The XOR gates 460, 462, 464 and 466 essentially compare the two 4-bit signals CAL_CNT<3:0> and CNT_VAL<3:0> to see if they are equal. CNT_VAL<3:0> remains static during the comparison, while CNT_VAL<3:0> keeps changing (counting up). When any one of the bits of CAL_CNT<3:0> is low and the respective bit of CNT_VAL<3:0> is high, or vice versa,—meaning CAL_CNT<3:0> and CNT_VAL<3:0> are not equal—the XOR gate that is comparing the unequal bits produces a high signal. For example, if the LSB of CAL_CNT<3:0> is high while the LSB of CNT_VAL<3:0> is low, then the output of the XOR gate 466 is high. A logic high signal at the input of either the OR gate 468 or the OR gate 470 causes the corresponding OR gate to produce a logic high output. A logic high signal at any one of the inputs of the NOR gate 472 causes the NOR gate to supply a logic low signal to the SR latch 480. In other words, when the signals CAL_CNT<3:0> and CNT_VAL<3:0> are not equal, at least one of the XOR gates 460, 462, 464 and 466 will be outputting a logic high and, through the OR gate 468 or the OR gate 470, at least one input of the NOR gate 472 will be a logic high, so gate 472 supplies a logic low and the SR latch 480 will not be set. The output OUT of the SR latch 480 keeps its previous state, which is low because the SR latch 480 has previously been reset by LOCAL_RST. Thus, the clock input DQS_EN to the D-flip flop 484 is low, and DQS_FIRST is low.

When CAL_CNT<3:0> eventually becomes equal to CNT_VAL<3:0>, each of the XOR gates 460, 462, 464 and 466 produces a low signal. Thus, the outputs of the OR gates 468 and 470 are also low. Since this comparison takes place during a memory read cycle, RD_WINDOW is high, and RD_WINDOW_B is low. Therefore, all three inputs of the NOR gate 472 are low, which causes the NOR gate to supply a logic high signal to the set input of SR latch 480. In other words, when the signals CAL_CNT<3:0> and CNT_VAL<3:0> are equal, the SR latch 480 will be immediately set. DQS_EN is then immediately set to high, and the D-flip flop 484 is immediately clocked and immediately sets DQS_FIRST to high.

During a calibration operation, CAL_DQS is high, and therefore the output of the NOR gate 486 is low regardless of whether RD_WINDOW_B is high or low. The logic low signal at the output of the NOR gate 486 is clocked into the D-flip flop 488 at each rising edge of CLK, and then outputted to the input of the NAND gate 490 by the D-flip flop 488. A logic low input at the NAND gate 490 from the flip flop 488 produces a logic high output DQS_EN_B, regardless of whether DQS_EN is high or low. Therefore, during a calibration operation, DQS_EN_B is always high. Stated differently, the output of flip flop 488 serves as a disable signal that prevents DQS_EN_B from occurring (going low) during the calibration mode.

During a normal memory read cycle, CAL_DQS is low and RD_WINDOW_B is also low, and therefore the output of the NOR gate is high. The logic high signal at the output of the NOR gate 486 is clocked into the D-flip flop 488 at each rising edge of CLK, and then outputted to the input of the NAND gate 490 by the D-flip flop 488. If DQS_EN is low, the NAND gate 490 receives a logic high input and a logic low input, and thus the output DQS_EN_B is still high. When DQS_EN goes high, the NAND gate 490 receives two active-high inputs and produces a logic low output DQS_EN_B. In other words, during a normal memory read operation, DQS_EN_B goes high if DQS_EN is low, and DQS_EN_B goes low if DQS_EN is high. It can be seen that DQS_EN_B is related to DQS_FIRST, since DQS_EN is also used to generate DQS_FIRST, and DQS_EN_B is the inverse of DQS_EN during a normal memory read cycle. The primary difference between DQS_FIRST and DQS_EN_B is that DQS_FIRST occurs during both calibration and normal memory read cycles, whereas DQS_EN_B occurs during normal memory read cycles but is disabled during calibration.

Figure 10:
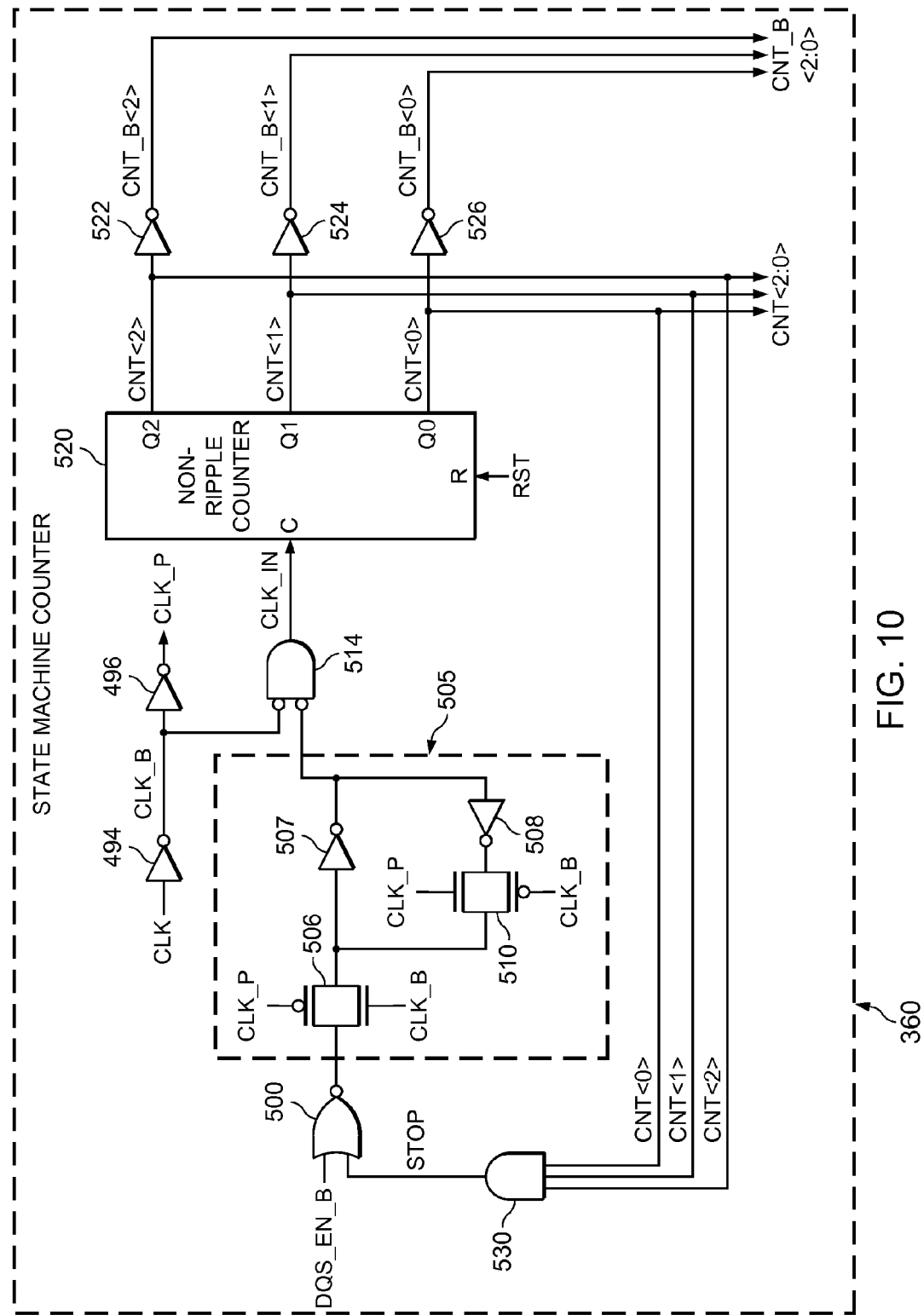

FIG. 10 is a circuit schematic showing the state machine counter 360 of FIG. 5 in more detail. The discussion below of FIG. 10 focuses primarily on the additional detail that is not shown in FIG. 5. An inverter 494 has an input coupled to the clock signal CLK and outputs a signal CLK_B. An inverter 496 has an input coupled to the signal CLK_B from the output of the inverter 494, and outputs a signal CLK_P, which is a slightly time-delayed version of CLK.

A 2-input NOR gate 500 has inputs that are coupled to the signal DQS_EN_B and a STOP signal that will be discussed shortly. A latch 505 is coupled to the output of the NOR gate 500. The latch 505 includes a transmission gate 506 that receives the output of the NOR gate 500. The transmission gate 506 has a PMOS control input coupled to CLK_P and an NMOS control input coupled to CLK_B. An inverter 507 has an input that receives the output of the transmission gate 506. An inverter 508 has an input that receives the output of the inverter 507. A transmission gate 510 has an input coupled to the output of the inverter 508 and an output coupled to the output of the transmission gate 506. The transmission gate 510 has a PMOS control input coupled to CLK_B and an NMOS control input coupled to CLK_P.

An AND gate 514 has two active-low inputs, and is functionally equivalent to a 2-input NOR gate. The gate 514 has one input that is coupled to the signal CLK_B from the output of the inverter 494 and a further input that is coupled to the output of the inverter 507, which serves as an output of the latch 505. The gate 514 outputs a clock signal CLK_IN. A non-ripple counter 520 has a clock input C that is coupled to CLK_IN from the output of the gate 514 and a reset input R that is coupled to the signal RST. The counter 520 has outputs Q0, Q1 and Q2 that output CNT<0>, CNT<1> and CNT<2>, respectively. CNT<0>, CNT<1> and CNT<2> are respective bits of the signal CNT<2:0>, CNT<0> being the LSB, and CNT<2> being the MSB.

Inverters 522, 524 and 526 receive the signals CNT<0>, CNT<1> and CNT<2>, respectively, and output signals CNT_B<0>, CNT_B<1> and CNT_B<2>, respectively. CNT_B<0>, CNT_B<1> and CNT_B<2> are respective bits of the signal CNT_B<2:0>, CNT_B<0> being the LSB, and CNT_B<2> being the MSB. A 3-input AND gate 530 has inputs that are coupled to CNT<0>, CNT<1> and CNT<2>. The AND gate 530 outputs the STOP signal to the NOR gate 500.

When the CLK signal goes low, CLK_B goes high and CLK_P goes low. Thus, the transmission gate 506 is turned on and lets signals pass through, while the transmission gate 510 is turned off and does not let signals pass through. Thus, the latch 505 becomes transparent and passes the inverse of the output of the NOR gate 500 to the gate 514. When the CLK signal goes high, CLK_B goes low and CLK_P goes high. Thus, the transmission gate 510 is turned on and lets signals pass through, while the transmission gate 506 is turned off and does not let signals pass through. Thus, the latch 505 is no longer transparent and latches the value that gate 500 was outputting when CLK went high. In other words, when CLK is low, the output from the NOR gate 500 is inverted while passing through the latch 505 to the input of the gate 514. When CLK is high, the output from the NOR gate 500 does not pass through the latch, and the signal latched in the latch 505 is outputted to the input of the gate 514.

The output of the latch 505 is essentially an enable/disable signal that, by means of the gate 514, determines whether or not the clock signal CLK_B reaches the counter 520, and thus whether or not the counter counts. The gate 514 is turned on and passes CLK_B (with inversion) only when the output of the latch 505 is low. Stated differently, as long as the output of the latch 505 is a logic high, the gate 514 is disabled, and the counter will not count.

When RST is high, the counter 520 is reset and outputs a binary value of 000 as the output CNT<2:0>. This in turn causes the output signal STOP of the AND gate 530 to go low. DQS_EN_B is at logic high initially. Thus, the output of the NOR gate 500 is a logic low, which is inverted and passed by the latch 505 to the input of the gate 514 as a logic high. Therefore, the gate 514 is disabled by a logic low signal STOP and a logic high DQS_EN_B, and the counter 520 does not count. However, DQS_EN_B eventually goes low (as discussed earlier). Since the signal STOP is also low, the output of the NOR gate 500 will change to a logic high, which is inverted and passed by the latch 505 to the input of the gate 514 as a logic low. Now, the gate 514 is enabled. At this point, the gate 514 will pass CLK_B (with inversion), which causes the counter 520 to start counting sequentially from binary 000 to binary 111.

When the counter 520 reaches a binary value of 111, the AND gate 530 causes the signal STOP to go high. A logic high STOP signal leads to a logic high signal at the input of the gate 514, regardless of what state DQS_EN_B is in. The gate 514 is disabled again and no longer passes CLK_B, and the counter stops counting. In other words, either the signal STOP or the signal DQS_EN_B can disable the gate 514.

Figure 11:
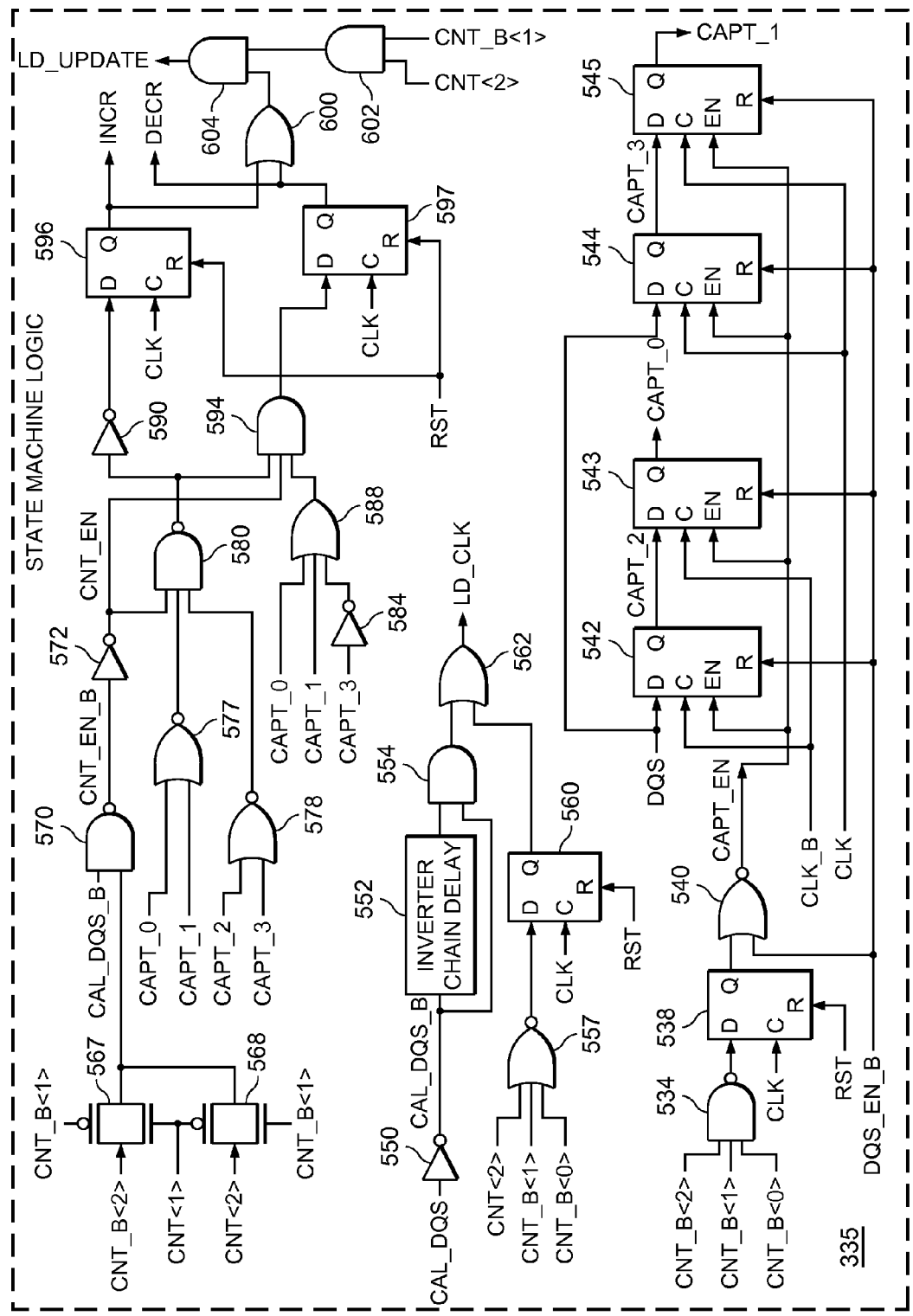

FIG. 11 is a circuit schematic showing the state machine logic 335 of FIG. 5 in more detail. The discussion below of FIG. 11 focuses primarily on the additional detail that is not shown in FIG. 5. A 3-input NAND gate 534 has inputs that are coupled to the signal CNT_B<0>, CNT_B<1> and CNT_B<2>, which is the output of the state machine counter 360. A D-flip flop 538 has a data input D coupled to the output of the NAND gate 534. The flip flop 538 also has a clock input C coupled to the clock signal CLK and a reset input R coupled to the reset signal RST. The flip flop 538 outputs data through a data output Q. A two-input NOR gate 540 has a first input coupled to the data output Q of the flip flop 538 and a second input coupled to the signal DQS_EN_B. The NOR gate 540 outputs a capture enable signal CAPT_EN.

Two D-flip flops 542 and 543 each have a clock input C that is coupled to the clock signal CLK_B, an enable input EN that is coupled to the output CAPT_EN of the NOR gate 540, and a reset input R that is coupled to the signal DQS_EN_B. The flip flop 542 has a data input D that is coupled to the signal DQS and a data output Q that outputs a signal CAPT__2. The flip flop 543 has a data input D that is coupled to the data output CAPT__2 from the output Q of the flip flop 542. The flip flop 543 has a data output D that outputs a signal CAPT__0.

Two D-flip flops 544 and 545 each have a clock input C that is coupled to the clock signal CLK, an enable input EN that is coupled to the output CAPT_EN of the NOR gate 540, and a reset input R that is coupled to the signal DQS_EN_B. The flip flop 544 has a data input D that is coupled to the signal DQS and a data output Q that outputs a signal CAPT__3. The flip flop 545 has a data input D that is coupled to the data output CAPT_3 from the output Q of the flip flop 544. The flip flop 545 has a data output D that outputs a signal CAPT__1.

An inverter 550 is coupled to the signal CAL_DQS and outputs a signal CAL_DQS_B. An inverter chain delay 552 has an input that is coupled to the output CAL_DQS_B from the inverter 550. The inverter chain delay 552 has an odd number of inverters. A 2-input AND gate 554 has inputs that are coupled to the output of the inverter chain delay 552 and the output signal CAL_DQS_B from the output of the inverter 550. A 3-input NOR gate 557 has three inputs that are coupled to the signals CNT<2>, CNT_B<1> and CNT_B<0>, respectively. A D-flip flop 560 has a data input D that is coupled to the output of the NOR gate 557, a clock input C that is coupled to the signal CLK, a reset input R that is coupled to the reset signal RST, and a data output Q. A 2-input OR gate 562 has one input coupled to the output of the AND gate 554 and a further input coupled to the data output Q of the flip flop 560. The OR gate 562 outputs the signal LD_CLK.

Two transmission gates 567 and 568 have respective PMOS and NMOS inputs that are each coupled to the signal CNT_B<1> and have respective NMOS and PMOS inputs that are each coupled to the signal CNT<1>. The transmission gate 567 has a data input that is coupled to the signal CNT_B<2>, and the transmission gate 568 has a data input that is coupled to the signal CNT<2>. The outputs of the transmission gates 567 and 568 are coupled together. A 2-input NAND gate 570 has inputs that are respectively coupled to the signal CAL_DQS_B and the outputs of the transmission gates 567 and 568. The NAND gate 570 has an output that produces a signal CNT_EN_B. An inverter 572 has an input coupled to the output CNT_EN_B of the NAND gate 570 and outputs a signal CNT_EN.

A 2-input NOR gate 577 has inputs that are respectively coupled to the signals CAPT__0 and CAPT__1 from the flip flops 543 and 545. A 2-input NOR gate 578 has inputs that are respectively coupled to the signals CAPT__2 and CAPT__3 from the flip flops 542 and 544. A 3-input NAND gate 580 has three inputs that are respectively coupled to the output signal CNT_EN of the inverter 572 and the outputs of the NOR gates 577 and 578.

An inverter 584 has an input that is coupled to the signal CAPT__3 from the flip flop 543. A 3-input OR gate 588 has three inputs that are respectively coupled to the signals CAPT__0 and CAPT__1 from the flip flops 543 and 545, and the output of the inverter 584. An inverter 590 has an input coupled to the output of the NAND gate 580. A 3-input NAND gate 594 has three inputs that are respectively coupled to the output of the NAND gate 580, the output signal CNT_EN of the inverter 572, and the output of the OR gate 588.

Two D-flip flops 596 and 597 each have a clock input C that is coupled to the clock signal CLK and a reset input R that is coupled to the reset signal RST. The flip flop 596 has a data input D that is coupled to the output of the inverter 590, and outputs the control signal INCR. The flip flop 597 has a data input D that is coupled to the output of the gate 594, and outputs the control signal DECR. A 2-input OR gate 600 has inputs that are respectively coupled to the signals INCR and DECR. A 2-input AND gate 602 has inputs that are respectively coupled to the signals CNT<2> and CNT_B<1>. A 2-input AND gate 602 has inputs that are respectively coupled to the output of the OR gate 600 and the output of the AND gate 602. The AND gate 604 outputs the control signal LD_UPDATE.

Referring back to FIG. 5, and as discussed earlier, the state machine logic 335 and the state machine counter 360 have eight states. The eight states can be divided into three time periods, where different operations occur in each time period. The first time period includes states 0 and 1, during which the DQS signal is sampled. The second time period includes states 2-5, during which the incrementing and decrementing operations are performed by the arithmetic unit 345, the register 350 gets loaded, and the latching unit 340 accepts and latches a value. The third time period includes states 6-7, during which the STOP signal (FIG. 10) is generated.

Referring again to FIG. 11, the flip flops 542-545 and 538 as well as the gates 534 and 540 form the previously-mentioned sampling circuit of the state machine logic 335. Until DQS_FIRST is generated, DQS_EN_B is at logic high, which keeps flip flops 542-545 reset, and no sampling occurs. In addition, the logic high DQS_EN_B at the input of the NOR gate 540 means the capture enable output CAPT_EN is a logic low, which disables the flip flops 542-545. At this time, the counter 520 of the state machine counter 360 (FIG. 10) remains reset at binary 000 and outputs logic lows, which in turn cause logic highs for CNT_B<2:0> at the inputs of the NAND gate 534. Thus, the output of the NAND gate 534 is a logic low, which gets clocked into the flip flop 538 and outputted to the input of the NOR gate 540.

After DQS_FIRST and DQS_EN_B are generated, the flip flops 542-545 will become enabled, but only for the first two states of the state machine logic 335. In particular, when DQS_FIRST is generated, DQS_EN_B goes low, so the flip flops 542-545 are no longer held in reset. The counter 520 starts to count, with each count value representing a different state of the state machine logic 335. For states 0 and 1, the outputs CNT<2:0> of the counter 520 are 000 and 001, respectively. The flip flop 538 "delays" the NOR gate 540 from seeing the output of the NAND gate 534 by one full clock cycle of CLK.

As such, the NOR gate 540 still receives a logic low from the output of the flip flop 538 during the first clock cycle, or state 0, since a logic low was outputted by the flip flop 538 before the signal DQS_EN_B was generated. Since the signal DQS_EN_B is low during state 0, two low inputs at the NOR gate 540 make the signal CAPT_EN go high, which enables the flip flops 542-545. During state 0, the NAND gate 534 supplies a logic low signal, which will be loaded into the flip flop 538 at the end of state 0 and outputted to the NOR gate 540.

At the end of state 0, the flip flop 538 loads the state of the output signal from the gate 534, which is a logic low. Consequently, the flip flop 538 loads and supplies a logic low signal during state 1. Therefore, nothing changes at the input of the NOR gate 540 during state 1. The signal CAPT_EN is still actuated, and the flip flops 542-545 remain enabled. During state 1, the output of the NAND gate 534 goes from low to high, but this transition happens shortly after the rising edge of the clock signal CLK at the start of state 1. It isn't until the start of state 2 that the logic high signal outputted by the NAND gate 534 during state 1 is finally clocked into the flip flop 538 and outputted to the NOR gate 540. At this time, CAPT_EN goes low, and the flip flops 542-545 become disabled again but are not reset.

During states 0 and 1, the flip flops 542-545 sample the state of the signal DQS four times, twice on falling edges of CLK, and twice on rising edges of CLK (or falling edges of CLK_B).

During state 0, the flip flop 542 is loaded with a state of DQS at the falling edge of CLK (the rising edge of CLK_B) and outputs this state of DQS to the input D of flip flop 543. Thereafter, the flip flop 544 is loaded with a state of DQS at the next rising edge of CLK and outputs this state of DQS as CAPT_3 to the input D flip flop 545.

During state 1, at the next falling edge of CLK, the flip flop 543 is loaded with the state of DQS that was loaded into the flip flop 542 during state 0. The flip flop 543 outputs this state as CAPT_0. Simultaneously, the flip flop 542 is loaded with a state of DQS at the same falling edge of CLK and outputs this value as CAPT_2. At the next rising edge of CLK, the flip flop 545 is loaded with the state of DQS that was loaded into the flip flop 544 during state 0. The flip flop 545 outputs this state as CAPT_1. Simultaneously, the flip flop 544 is loaded with a state of DQS at the same rising edge of CLK and outputs this value as CAPT_3.

At the start of state 2, CAPT_EN goes low and the flip flops 542-545 become disabled, and the outputs CAPT_0, CAPT_1, CAPT_2 and CAPT_3 remain at the values stored in the flip flops during states 0 and 1. Together, the signals CAPT_0, CAPT_1, CAPT_2 and CAPT_3 give a snapshot of the pattern of the signal DQS during a time interval just after DQS_FIRST is generated.

The second time period includes states 2-5. The NAND gate 570 serves as an enable/disable switch that turns on or off the incrementing and decrementing operations. During calibration, CAL_DQS_B is low, which turns off the NAND gate 570, and no incrementing nor decrementing operation is performed. During a normal memory read cycle, the NAND gate 570 turns on during states 2-5. This is because CAL_DQS_B stays high during the normal memory read cycle, and the transmission gates 567-568 supply a logic high only during states 2-5.

The state machine logic 335 is designed to ensure that DQS_FIRST occurs shortly before or at the same time as the DQS signal. This is done to partially compensate for the propagation delay of sending the DQS_FIRST signal to other sections of the memory controller 240, so that these sections will have time to then react to DQS_FIRST and then look for DQS. Table 1 shows the potential sample patterns and the corresponding action to be performed by the arithmetic unit 345 (FIG. 5) for each of the sample patterns. Reading the sample patterns from left to right, a transition from 0 to 1 represents a leading edge of DQS, and a transition from 1 to 0 represents a falling edge of DQS. A sample pattern of binary 0000 means that the four samples were all taken before the rising edge of DQS occurred, which in turn means that the estimated time delay between RD_WINDOW and DQS was too short and needs to be lengthened. In other words, the signal DQS_FIRST was generated too soon before DQS, and therefore needs to be generated a little bit later. Consequently, the state machine logic 335 will instruct the arithmetic unit 345 (FIG. 5) to increment the time delay estimate value from the latching unit 340. Conversely, when a sample pattern of DQS has a binary value of 0111, 1111, 1110, 1100 or 1000, the estimated time delay between RD_WINDOW and DQS was too long and needs to be shortened. In other words, the signal DQS_FIRST was generated after DQS or too little before DQS, and therefore needs to be generated a little bit earlier. Consequently, the state machine logic 335 will instruct the arithmetic unit 345 to decrement the time delay estimate value from the latching unit 340 (FIG. 5). When a sample pattern of DQS has a binary value of 0001 or 0011, the estimated time delay between RD_WINDOW and DQS is in an acceptable range, and thus no action needs to be taken. The rest of the possible binary values, such as 0101 or 1010, should not occur for the sample pattern of DQS, because DQS does not change that fast, and for clarity Table 1 does not show these sample patterns.

TABLE 1

| Sample pattern of DQS (CAPT_0, CAPT_1, CAPT_2, CAPT_3) | Action to be performed by arithmetic unit 345 |
| --- | --- |
| 0000 | Increment |
| 0001 | No Action |
| 0011 | No Action |
| 0111 | Decrement |
| 1111 | Decrement |
| 1110 | Decrement |
| 1100 | Decrement |
| 1000 | Decrement |

Therefore, the gates 577, 578, 580 and 590 ensure that the flip flop 596 clocks in and supplies a logic high signal as INCR only when the capture signals CAPT_0, CAPT_1, CAPT_2 and CAPT_3 are all logic lows in the normal operational mode during states 2-5. The gates 584, 585, 588 and 594 ensure that the flip flop 597 clocks in a logic high signal that is then outputted as DECR only when the capture signals CAPT_0, CAPT_1, CAPT_2 and CAPT_3 have binary values of 0111, 1111, 1110, 1100 or 1000 in the normal operational mode during states 2-5. Also, due in part to the inverter 590, INCR and DECR can never be high at the same time.

Therefore, the incrementing and decrementing operations occur only during states 2-5 of the state machine logic 335. In response to the INCR signal or the DECR signal, the arithmetic unit 345 takes the value from the latching unit 340 and makes an adjustment if appropriate, by incrementing or decrementing the value if INCR or DECR is high, or by making no change if INCR and DECR are both low. After one or more such adjustments during successive memory reads, eventually the DQS_FIRST signal will be generated within a desired time window that is at or before the DQS signal.

The adjusted value is outputted from the arithmetic unit 345 to the register 350 (FIG. 5) and is loaded into the register when the control signal LD_CLK is actuated. The NOR gate 557 supplies a logic high signal only during state 3. This logic high signal is loaded into the flip flop 560 and is outputted to the OR gate 562 at the start of state 4. Thus, LD_CLK is actuated at the beginning of state 4, and this is the point in time when the register 350 is loaded. If the value in the register 350 is selected by the selection unit 330 of FIG. 5, it will be accepted by the latching unit 340 during states 4 and 5, and latched into the latching unit at the end of state 5.

The AND gate 602 ensures that the AND gate 604 is enabled only during states 4 and 5. Thus, LD_UPDATE is actuated only during states 4 and 5, and only when either the INCR or the DECR signal is actuated. As discussed earlier in association with FIG. 5, LD_UPDATE causes the latching unit 340 to accept and latch a value. Thus, the latching unit 340 is updated when the estimated time delay between RD_WINDOW and DQS needs to be adjusted during the second time period.

The third time period includes states 6-7. The stop signal STOP is generated by the gate 530 (FIG. 10) during state 7, and stops the counter 520 at binary 111, as discussed earlier.

In addition to being actuated at state 4 during the normal memory read operation, the signal LD_CLK can alternatively be actuated for a period of time after the calibration period ends, but this period of actuation lasts only for a brief period of time that is dependent on the number of inverters in the inverter chain 552. During calibration, the signal CAL_DQS is high, CAL_DQS_B is low, and the signal at the output of the inverter chain delay is high. When the calibration period ends, CAL_DQS goes low and CAL_DQS_B goes high, and the inverter chain delay 552 still maintains a logic high for a period of time that is dependent on how many inverters are in the inverter chain. The only through inverter chain delay 552 determines the amount of time for which LD_CLK is actuated.

Figure 12:
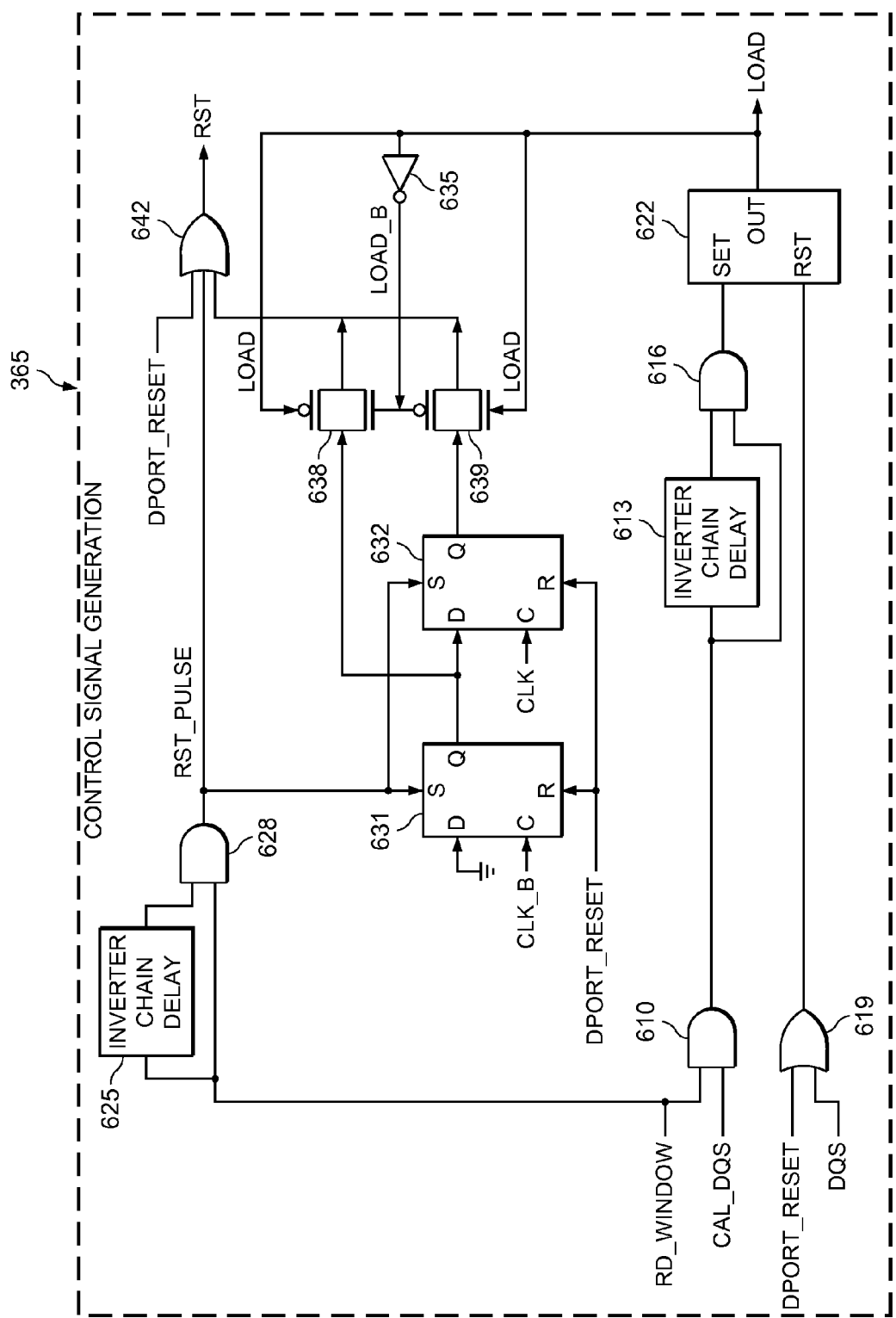

FIG. 12 is a circuit schematic showing the control signal generation 365 of FIG. 5 in more detail. The discussion below of FIG. 12 focuses primarily on the additional detail that is not shown in FIG. 5. A 2-input AND gate 610 has inputs that are respectively coupled to the control signals RD_WINDOW and CAL_DQS. An inverter chain delay 613 has an input that is coupled to the output of the AND gate 610. The inverter chain delay 613 has an odd number of inverters. A 2-input AND gate 616 has inputs that are respectively coupled to the output of the inverter chain delay 616 and the output of the AND gate 610. A 2-input OR gate 619 has inputs that are respectively coupled to the reset signal DPORT_RESET and the signal DQS. An SR latch 622 has a set input SET that is coupled to the output of the AND gate 616 and a reset input RST that is coupled to the output of the OR gate 619. The SR latch 622 has an output OUT that outputs the control signal LOAD.

An inverter chain delay 625 has an input that is coupled to the control signal RD_WINDOW. The inverter chain delay 625 has an odd number of inverters. A 2-input AND gate 628 has inputs that are respectively coupled to the signal RD_WINDOW and the output of the inverter chain delay 625.

The AND gate 628 outputs a reset signal RST_PULSE. Two flip flops 631 and 632 each have asynchronous set inputs S that are coupled to the output signal RST_PULSE from the output of the AND gate 628. The flip flops 631 and 632 each have reset inputs R that are coupled to the reset signal DPORT_RESET. The flip flops 631 and 632 have clock inputs C that are respectively coupled to CLK_B and CLK. The flip flop 631 has a data input D that is coupled to ground, and has a data output Q. The flip flop 632 has a data input D that is coupled to the output Q of the flip flop 631, and has a data output Q.

An inverter 635 has an input coupled to the signal LOAD from the output of the SR latch 622, and has an output that produces a signal LOAD_B. Two transmission gates 638 and 639 have data inputs that are respectively coupled to the data outputs of the flip flops 631 and 632. The transmission gate 638 has an NMOS control input coupled to the signal LOAD_B and a PMOS control input coupled to the signal LOAD. The transmission gate 639 has an NMOS control input coupled to the signal LOAD and a PMOS control input coupled to the signal LOAD_B.

Before calibration, the signal CAL_DQS is low, which causes the AND gate 610 to supply a logic low signal that is then inverted into a logic high signal by the inverter chain delay 613. When the calibration modes is switched on, CAL_DQS goes high, and the signal RD_WINDOW goes high as well, which cause the AND gate 610 to supply a logic high signal. The output of the inverter chain delay 613 remains high for a predetermined amount of time that is dependent upon the number of inverters in the inverter chain delay. Thus, the AND gate 616 outputs a short logic high pulse, which sets the SR latch 622 and actuates the signal LOAD. When this happens, the latching unit 340 (FIG. 5) becomes transparent and passes data present at the input of the latching unit.

The signal LOAD is de-actuated when the SR latch 622 is reset, which occurs when either the signal DPORT_RESET or the signal DQS goes high. Therefore, when the signal DQS first goes high during calibration, the signal LOAD goes low and disables the latching unit 340. The value at the input of the latching unit 340 at that time, which is the value of the counter 320 (FIG. 5) representing the initial time delay between RD_WINDOW and DQS, is latched into the latching unit.

The OR gate 642 actuates the reset signal RST when DPORT_RESET is high, which is typically associated with an initial power up reset. The OR gate 642 also actuates the reset signal RST when the signal RST_PULSE is high, which occurs when the signal RD_WINDOW switches from low to high. RST_PULSE remains high for a predetermined amount of time that is dependent upon the number of inverters in the inverter chain delay 625. The flip flops 631 or 632 are set by the signal RST_PULSE and each immediately output a logic high signal. The output of the flip flop 631 passes through the transmission gate 638 during a normal memory read operation, and the output of the flip flop 632 passes through the transmission gate 639 during calibration. The logic high output from the selected one of the flip flops 631 or 632 reaches the gate 642 while RST_PULSE is still high, and remains high after RST_PULSE goes low, to keep the signal RST actuated.

When the signal RST_PULSE goes low, the flip flops 631 and 632 are no longer being set. However, the flip flop 631 still supplies a logic high signal until it clocks in a logic low at the next falling edge of CLK. This logic low is then clocked into the flip flop 632 at the next leading edge of CLK. Since the output of the flip flop 631 passes through the transmission gate 638 during the normal memory read operation, the RST pulse initiated by RST_PULSE is essentially "extended" by the flip flop 631 and transmission gate 638 for a short period of time. This means that during a normal memory read operation, RST remains high for a little while even after RST_PULSE goes low.

During the calibration period, the transmission gate 638 is turned off and the transmission gate 639 is turned on, which means that only the flip flop 632 can extend RST_PULSE. RST remains high until the logic low output of the flip flop 631 is clocked into and outputted by the flip flop 632. Hence, during the calibration period, the signal RST remains high longer than for a normal memory read.

Therefore, the flip flops 631 and 632 and the transmission gates 639 and 639 serve to essentially extend RST_PULSE. In other words, RST_PULSE starts a RST signal, and the flip flops 631 and 632 and the transmission gates 639 and 639 determine when that RST signal ends.

Figure 13:
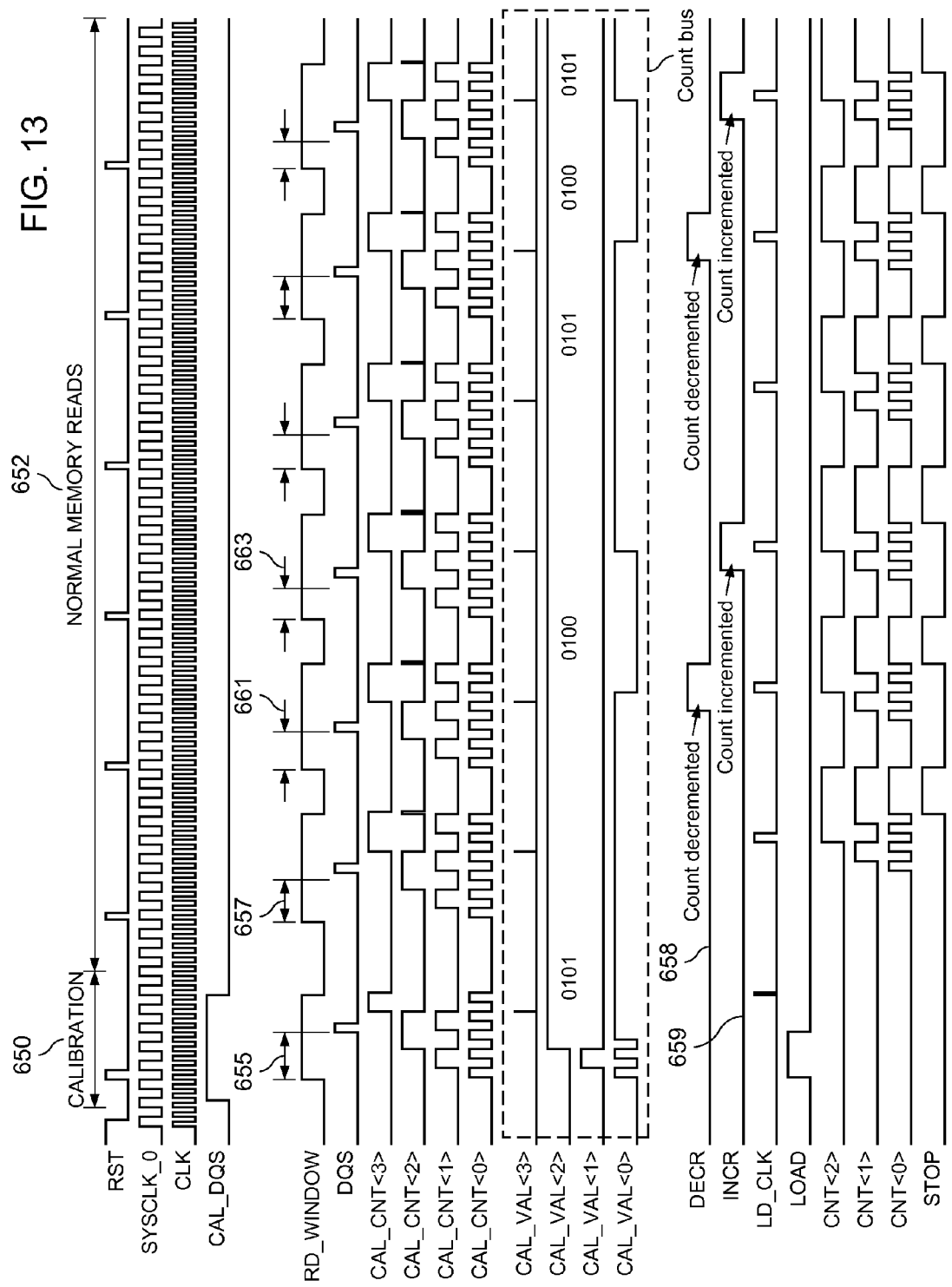
FIG. 13 is a timing diagram illustrating various signals in the circuitry of FIGS. 3-12.

FIG. 13 is a timing diagram showing various signals discussed above in association with FIGS. 3-12. FIG. 13 shows an example of a calibration period at 650, and examples of several normal memory read periods at 652. The actuation of the signal CAL_DQS marks the beginning of the calibration period 650. The signal RD_WINDOW goes high during the calibration period, and the delay between the rising edges of RD_WINDOW and the signal DQS is measured as an initial delay estimate 655. This is the value loaded into the latching unit 340 during calibration. The signal CAL_DQS is de-actuated at the end of each calibration period.

The normal memory read period 652 contains one or more memory read operations, each memory read operation being framed by an actuation of the signal RD_WINDOW. For the sake of simplicity, six memory read operations are shown here, and only one instance of the signal DQS is shown in each actuation of RD_WINDOW. The initial delay estimate 655 obtained during the calibration period 650 is used to provide an estimation of a point in time where the signal DQS is expected to occur during the first memory read in period 652.

When RD_WINDOW is first actuated during the memory read period 652, a time period 657 that is based on the value in the latching unit 340 and that is equal to the initial delay estimate 655 is allowed to pass. At the end of the time period 657, the signals DQS_FIRST and DQS_EN_B (not shown in FIG. 3) are generated and the signal DQS is sampled to determine when DQS actually occurred. In this case, DQS occurred within an acceptable time range, so the value in the latching unit 340 representing the initial delay estimate 655 does not need to be adjusted, and thus neither the DECR signal 658 nor the INCR signal 659 is actuated.

During the next memory read operation, a time period 661 that is equal to the initial delay estimate 655 is allowed to pass. At the end of the time period 661, the signals DQS_FIRST and DQS_EN_B (not shown in FIG. 3) are generated again and the signal DQS is sampled again to determine when DQS actually occurred. In this case, DQS occurred before the acceptable time range, which means the initial delay estimate 655 is too long and needs to be shortened. Thus, the DECR signal 658 is actuated to decrease the value in the latching unit 340 so it will produce a smaller delay estimate for the next memory read operation.

During the next memory read operation, a time period 663 that is shorter than the initial delay estimate 655 is allowed to pass, based on the modified value currently in the latching unit 340. At the end of the time period 663, the signal DQS_FIRST (not shown in FIG. 3) is generated yet again and the signal DQS is sampled yet again to determine when DQS actually occurred. In this case, DQS occurred after the acceptable time range, which means the initial delay estimate 655 is too short and needs to be lengthened. Thus, the INCR signal 659 is actuated to adjust the value in the latching unit 340 to produce a greater delay estimate for the next memory read operation.

Figure 14:
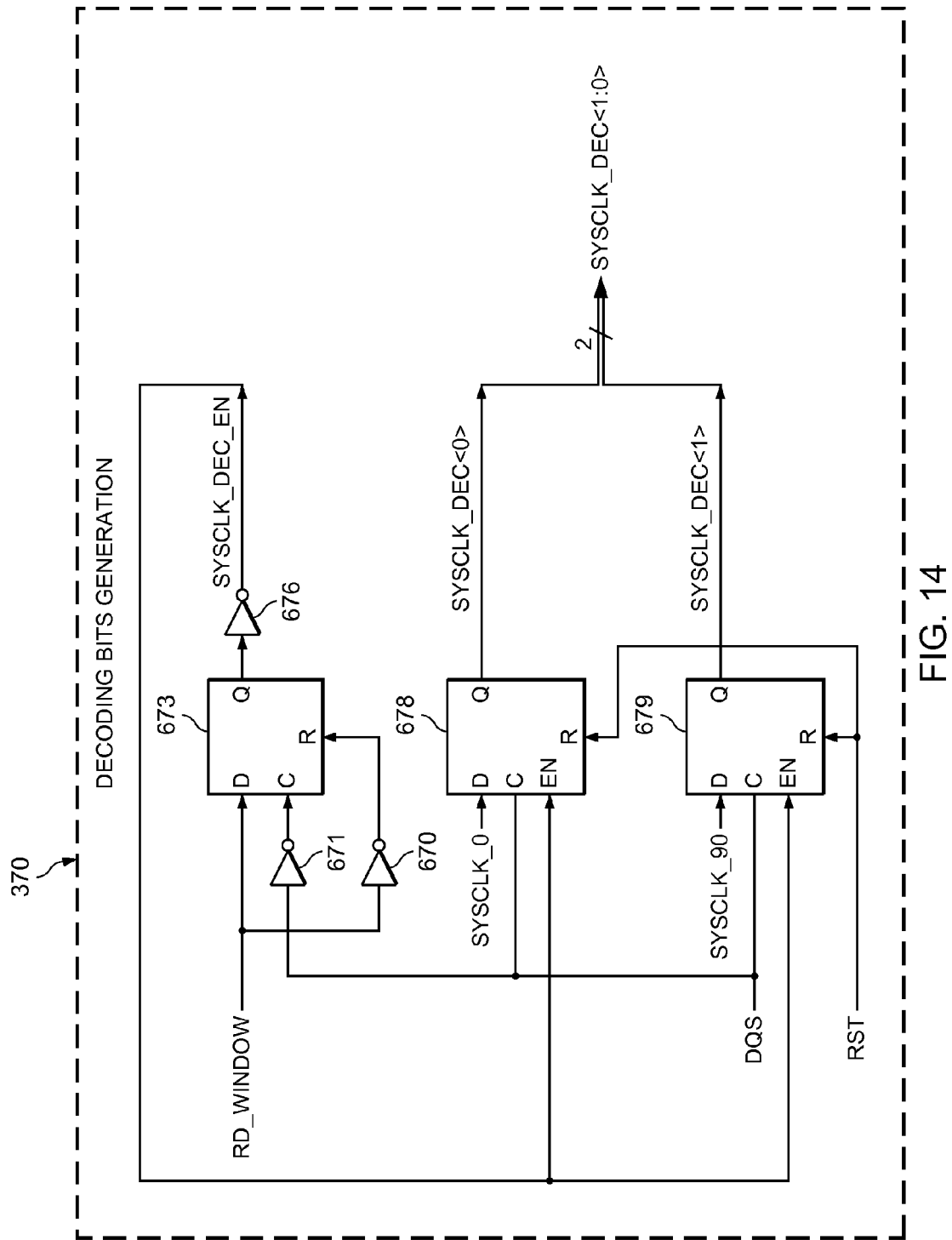
FIG. 14 is a circuit schematic showing a decoding bits generation section of the preamble detection circuit of FIG. 5.

FIG. 14 is a circuit schematic showing the decoding bits generation 370 of FIG. 5 in more detail. The discussion below of FIG. 14 focuses primarily on the additional detail that is not shown in FIG. 5. Two inverters 670 and 671 have inputs that are respectively coupled to the signals RD_WINDOW and DQS. A flip flop 673 has a clock input C coupled to the output of the inverter 671, a reset input R coupled to the output of the inverter 670, a data input D coupled to the signal RD_WINDOW, and a data output Q. An inverter 676 has an input that is coupled to the data output Q of the flip flop 673. The inverter 676 outputs an enable signal SYSCLK_DEC_EN.

Two flip flops 678 and 679 have clock inputs C that are coupled to the signal DQS, reset inputs R that are coupled to the reset signal RST, enable inputs EN that are coupled to the enable signal SYSCLK_DEC_EN from the output of the inverter 676, data inputs D that are respectively coupled to the system clock signals SYSCLK_0 and SYSCLK_90 (FIG. 3), and data outputs Q that output decoding signals SYSCLK_DEC<0> and SYSCLK_DEC<1>, respectively.

As mentioned previously in association with FIGS. 3 and 5, the decoding signals SYSCLK_DEC<0> and SYSCLK_DEC<1> will be used by a transitional clock generation circuit (discussed later in more detail) to select one of the four system clock signals (SYSCLK_0, SYSCLK_90, SYSCLK_180 and SYSCLK_270) generated by the system clock generation 260 of FIGS. 3 and 4 as the transitional clock signal. As discussed in more detail later, the transitional clock signal ensures that data sent in the DQS time domain from the memory device 232 can be transitioned without loss over to the system clock time domain of the memory controller 240, which uses primarily the system clock signal SYSCLK_90. To accomplish this, the transitional clock generation circuit needs to know when the signal DQS is actuated relative to the system clock signals (SYSCLK_0, SYSCLK_90, etc.). This is done by the clocking the flip flops 678 and 679 with DQS and feeding the data inputs D of the flip flops with SYSCLK_0 and SYSCLK_90, respectively. In essence, the decoding signals SYSCLK_DEC<1> and SYSCLK<0> convey the phase relationship between the system clock signals and DQS to the transitional clock generation circuit.

When the memory controller 240 is performing a memory read operation, RD_WINDOW is high, and the flip flops 678 and 679 are enabled and are clocked by the rising edge of the first DQS pulse. Thus, the current states of the system clock signals SYSCLK_0 and SYSCLK_90 at the first rising edge of DQS are loaded into the flip flops 678 and 679, respectively, and outputted as SYSCLK_DEC<0> and SYSCLK_DEC<1>, respectively. The flip flop 673 gets clocked by the inverse of DQS (falling edge of DQS), which occurs while RD_WINDOW is high and loads the flip flop 673 with a logic high. This logic high signal is inverted by the inverter 676 so that the enable signal SYSCLK_DEC_EN has a logic low and therefore disables the flip flops 678 and 679. At this point in time, the respective outputs SYSCLK_DEC<0> and SYSCLK_DEC<1> of the flip flops 678 and 679 are "locked." Thus, the decoding signals SYSCLK_DEC<0> and SYSCLK_DEC<1> are generated once during each memory read operation, and after that, the value of the decoding signals SYSCLK_DEC<0> and SYSCLK_DEC<1> remain unchanged during that memory read operation.

Figure 15:
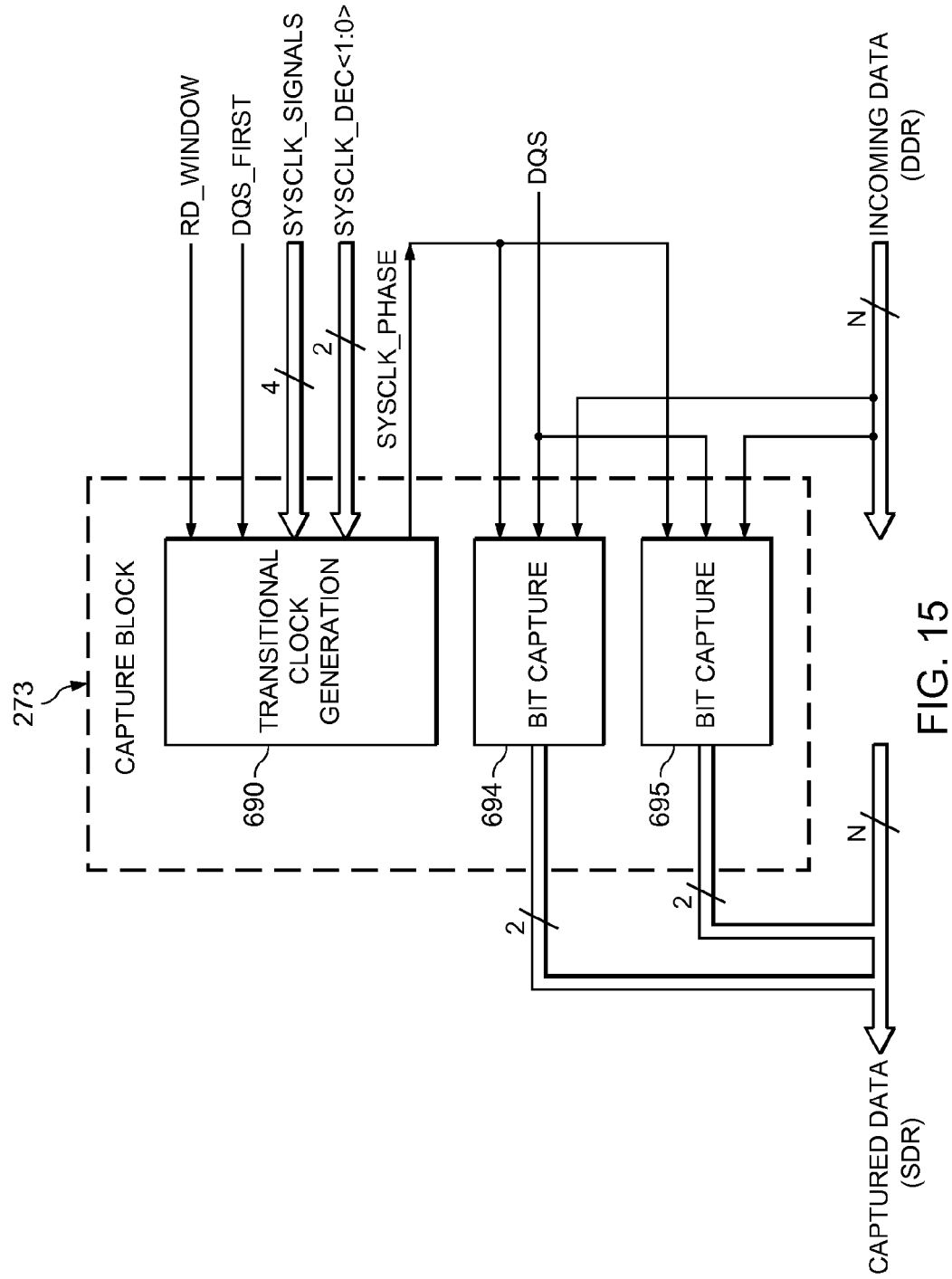
FIG. 15 is a block diagram showing a capture block circuit within the FPGA architecture of FIG. 3.

The multiple capture blocks 273 through 274 of FIG. 3 are identical, and so only the capture block 273 is described in detail below. FIG. 15 is a block diagram showing the capture block 273 of FIG. 3 in more detail. The capture block 273 has a transitional clock generation 690 and two bit captures 694 and 695. The transitional clock generation 690 has inputs that are respectively coupled to the control signal RD_WINDOW, the signal DQS_FIRST (FIG. 9), the SYSCLK system clock signals (SYSCLK_0, SYSCLK_90, SYSCLK_180 and SYSCLK_270), and the decoding signal SYSCLK_DEC<1:0> (FIG. 14). The transitional clock generation 690 has an output that produces a transitional clock signal SYSCLK_PHASE.

The bit captures 694 and 695 each have inputs that are respectively coupled to the signal DQS and the transitional clock signal SYSCLK_PHASE from the transitional clock generation 690. The bit captures 694 and 695 also each have a data input that receives a respective bit of the incoming data 270 sent by the memory device 232 of FIG. 3. The bit captures 694 and 695 each have an output that produces two bits of captured data.

As described above in association with FIG. 14, the decoding signals SYSCLK_DEC<1:0> convey information about the current phase relationship between the SYSCLK system clock signals and DQS to the transitional clock generation 690. The transitional clock generation 690 knows approximately when the signal DQS will occur, based on the signal DQS_FIRST. The transitional clock generation 690 generates the transitional clock signal SYSCLK_PHASE to help transition data from the DQS time domain to the time domain of the SYSCLK_90 signal used by the memory controller 240. SYSCLK_PHASE is a selected one of the following system clock signals: SYSCLK_0, SYSCLK_90 and SYSCLK_270. The signal DQS and the system clock signals are mesochronous, meaning they have the same frequency but different phases. The selection of SYSCLK_PHASE is carried out in a manner such that the data transition from the DQS domain to the SYSCLK_90 domain will occur without losing information. A different system clock signal may be selected for use as SYSCLK_PHASE for each memory read.

As mentioned before, the incoming data signal from the memory device 232 contain double data rate (DDR) data. The bit captures 694 and 695 each capture DDR data by capturing two successive data bits, so that single data rate (SDR) data can be obtained as captured data. The details of this operation will be discussed in more detail shortly.

Figure 16:
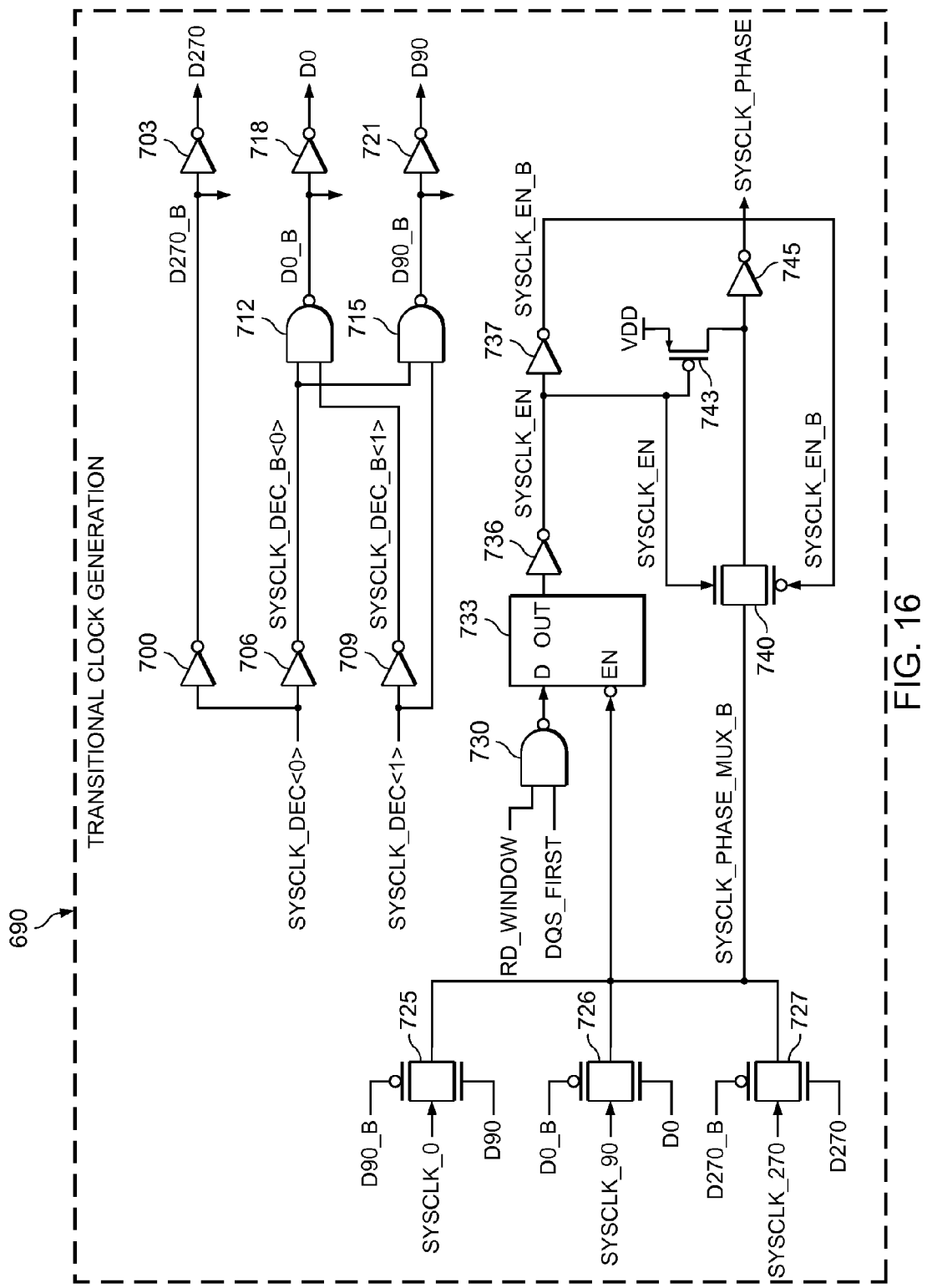
FIGS. 16-17 are respective circuit schematics of a transitional clock generation section and a bit capture section of the capture block circuit of FIG. 15.

FIG. 16 is a circuit schematic showing the transitional clock generation 690 of FIG. 15 in more detail. The discussion below of FIG. 16 focuses primarily on the additional detail that is not shown in FIG. 15. An inverter 700 has an input coupled to the decoding signal SYSCLK_DEC<0> and an output that produces a control signal D270_B. An inverter 703 has an input coupled to the signal D270_B from the output of the inverter 700. The inverter 703 outputs a control signal D270. Two inverters 706 and 709 have inputs that are respectively coupled to the decoding signals SYSCLK_DEC<0> and SYSCLK_DEC<1> and outputs that respectively output inverted decoding signals SYSCLK_DEC_B<0> and SYSCLK_DEC_B<1>. A 2-input NAND gate 712 has inputs that are respectively coupled to the signal SYSCLK_DEC_B<0> from the output of the inverter 706 and the signal SYSCLK_DEC_B<1> from the output of the inverter 709. A 2-input NAND gate 715 has inputs that are respectively coupled to the signal SYSCLK_DEC_B<0> from the output of the inverter 706 and the decoding signal SYSCLK_DEC <1>. The NAND gates 712 and 715 have outputs that produce control signals D0_B and D90_B, respectively. Two inverters 718 and 721 have inputs that are coupled to signals D0_B and D90_B from the outputs of the NAND gates 712 and 715, respectively. The inverters 718 and 721 have outputs that produce control signals D0 and D90, respectively.

Three transmission gates 725, 726 and 727 have data inputs that are respectively coupled to the system clock signals SYSCLK_0, SYSCLK_90 and SYSCLK_270, NMOS control inputs that are respectively coupled to the control signals D90 from the output of the inverter 721, D0 from the output of the inverter 718, and D270 from the output of the inverter 703, and PMOS control inputs that are respectively coupled to the control signals D90_B from the output of the NAND gate 715, D0_B from the output of the NAND gate 712, and D270_B from the output of the inverter 700. The data outputs of the transmission gates 725-727 are coupled together and carry an enable signal SYSCLK_PHASE_MUX_B. The transmission gates 725-727 basically serve as a 3-to-1 selector. A 2-input NAND gate 730 has inputs that are respectively coupled to the signals RD_WINDOW and DQS_FIRST. A latch 733 has a data input D that is coupled to the output of the NAND gate 730, an active-low enable input EN that is coupled to the signal SYSCLK_PHASE_MUX_B from the outputs of the transmission gates 725-727, and a data output OUT. An inverter 736 has an input coupled to the data output OUT of the latch 733 and an output that produces an enable signal SYSCLK_EN. An inverter 737 has an input that is coupled to the signal SYSCLK_EN from the output of the inverter 736. The inverter 737 has an output that produces a signal SYSCLK_EN_B, which is the inverse of the signal SYSCLK_EN.

A transmission gate 740 has a data input coupled to the signal SYSCLK_PHASE_MUX_B from the outputs of the transmission gates 725-727, an NMOS control input that is coupled to the signal SYSCLK_EN from the output of the inverter 736, and a PMOS control input that is coupled to the signal SYSCLK_EN_B from the output of the inverter 737. A PMOS transistor 743 has a gate coupled to the signal SYSCLK_EN from the output of the inverter 736, a source coupled to VDD, and a drain coupled to the data output of the transmission gate 740. An inverter 745 has an input that is coupled to the output of the transmission gate 740. The inverter has an output that carries the transitional clock signal SYSCLK_PHASE.

When either of the signals RD_WINDOW and DQS_FIRST is low, either the memory controller 240 is not performing a memory read operation, or the memory device 232 is not sending valid data yet during a memory read operation. Thus, the output of the NAND gate 730 is high, which causes the latch 733 to supply a logic high signal that is then inverted by the inverter 736 so that the enable signal SYSCLK_EN has a logic low. This means that the transmission gate 740 is turned off, and no output signal from the transmission gates 725-727 can pass through the transmission gate 740. Also, the PMOS transistor 743 is turned on by the logic low signal at its gate, and thus the input of the inverter 745 is pulled to VDD, causing the inverter 745 to supply a logic low as SYSCLK_PHASE.

When the signals RD_WINDOW and DQS_FIRST are both high, it indicates the memory controller 240 is performing a normal read operation and has just detected that the memory device 232 is starting to send valid data. Thus, the output of the NAND gate 730 goes low, which causes the latch 733 to supply a logic low signal that is then inverted by the inverter 736 so that the enable signal SYSCLK_EN has a logic high. At this point, the transmission gate 740 turns on and lets the output signal from the transmission gates 725-727 pass through, and the PMOS transistor 743 is turned off and acts as an open circuit between the output of the inverter 736 and the input of the inverter 745.

The inverters 700, 703, 706, 709, 718 and 721 and the NAND gates 712 and 715 essentially convert the decoding signals SYSCLK_DEC<0> and SYSCLK<1> into the control signals D0, D0_B, D90, D90_B, D270 and D270_B for the transmission gates 725-727, so that one of the system clock signals SYSCLK__0, SYSCLK__90 or SYSCLK__270 is selected to pass through the transmission gate 740 as the signal SYSCLK_PHASE_MUX_B. The signal SYSCLK_PHASE_MUX_B is then inverted by the inverter 745 to produce the transitional clock signal SYSCLK_PHASE.

More particularly, when the decoding signals SYSCLK_DEC<1> and SYSCLK<0> are binary 00, the system clock signal SYSCLK90 passes through the transmission gate 726. After passing through the transmission gate 740 when the gate 740 is turned on, SYSCLK__90 is inverted by the inverter 745, which is approximately equivalent to undergoing a 180 degree phase shift. Thus, SYSCLK__90 transforms into a signal equivalent to SYSCLK__270, which is selected as the transitional clock signal SYSCLK_PHASE. When the decoding signals SYSCLK_DEC<1> and SYSCLK<0> are binary 10, the system clock signal SYSCLK__0 passes through the transmission gate 725. After passing through the transmission gate 740 when the gate 740 is turned on, SYSCLK__0 is then phase shifted 180 degrees by the inverter 745. Thus, SYSCLK__0 transforms into a signal equivalent to SYSCLK__180, which is selected as the transitional clock signal SYSCLK_PHASE. When the decoding signals SYSCLK_DEC<1> and SYSCLK<0> are binary 01 or 11, the system clock signal SYSCLK__270 passes through the transmission gate 727. After passing through the transmission gate 740 when the gate 740 is turned on, SYSCLK__270 is then phase shifted 180 degrees by the inverter 745. Thus, SYSCLK__270 transforms into a signal equivalent to SYSCLK__90, which is selected as the transitional clock signal SYSCLK_PHASE.

Figure 17:
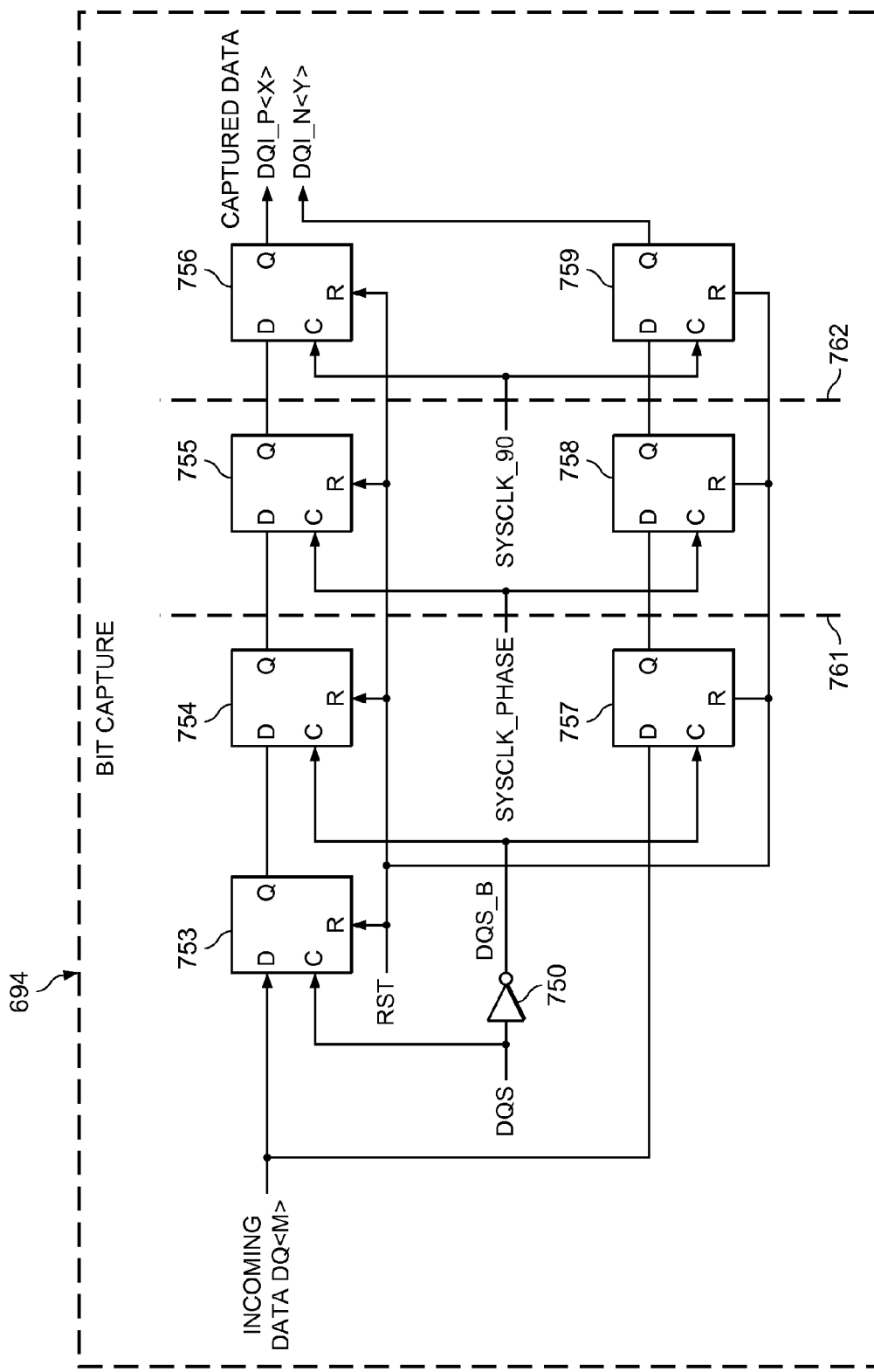

The bit captures 694 and 695 of FIG. 15 are identical, and thus only the bit capture 694 is described in detail. FIG. 17 is a circuit schematic showing the bit capture 694 of FIG. 15 in more detail. The discussion below of FIG. 17 focuses primarily on the additional detail that is not shown in FIG. 15. An inverter 750 has an input coupled to the signal DQS and an output that produces a signal DQS_B, which is the inverse of DQS. Seven flip flops 753, 754, 755, 756, 757, 758 and 759 each have a reset input R that is coupled to the reset signal RST. The flip flop 753 has a data input D that is coupled to one bit DQ<M> of the incoming data signal, a clock input that is coupled to the signal DQS, and an output Q.

The flip flops 754-756 have clock inputs C that are respectively coupled to the signal DQS_B from the output of the inverter 750, the transitional clock signal SYSCLK_PHASE and the system clock signal SYSCLK__90. The flip flops 754-756 also have data inputs D and data outputs Q. The data input D of the flip flop 754 is coupled to the output Q of the flip flop 753. The data input D of the flip flop 755 is coupled to the output Q of the flip flop 754. The data input D of the flip flop 756 is coupled to the output Q of the flip flop 755. The flip flop 756 outputs a captured data bit DQI_P<X> from its output Q. DQI_P represents data present at the positive edge of the DQS signal.

The flip flops 757-759 have clock inputs C that are respectively coupled to the signals DQS_B, SYSCLK_PHASE and SYSCLK__90. The flip flops 757-759 also have data inputs D and data outputs Q. The data input D of the flip flop 757 is coupled to the incoming data signal DQ<M>. The data input D of the flip flop 758 is coupled to the output Q of the flip flop 757. The data input D of the flip flop 759 is coupled to the output Q of the flip flop 758. The flip flop 759 outputs a captured data bit DQI_N<Y> from its output Q. DQI_N represents data present at the negative edge of the DQS signal.

As mentioned before in association with FIG. 3, the incoming data signal DQ<M> contains DDR data, meaning that it contains different valid data bits at the rising edges and the falling edges of the signal DQS. The bit capture 694 converts this DDR data into SDR data by having the flip flops 753-756 capture the data associated with the rising edges of DQS, and by having the flip flops 757-759 capture the data associated with the falling edges of DQS.

More specifically, a state of the incoming data signal DQ<M> is stored into the flip flop 753 at a rising edge of DQS. At a falling edge of DQS immediately following the rising edge, this stored state is moved into the flip flop 754. At the same falling edge, another state of the incoming data signal DQ<M> is stored into the flip flop 757. Next, the stored states in the flip flops 754 and 757 are respectively clocked into the flip flops 755 and 758 by the transitional clock signal SYSCLK_PHASE. Finally, these states in the flip flops 755 and 758 are respectively clocked into the flip flops 756 and 759 by the system clock signal SYSCLK__90. At this point, the flip flops 756 and 759 output the signals DQI_P<X> and DQI<Y> as part of the captured data.

Thus, an interface 761 and an interface 762 are formed in the bit capture 694. The interfaces 761 and 762 are each designated by a broken line, and signals flow through the interfaces 761 and 762. The interface 761 marks a transition of the incoming data DQ<M> from the time domain of the memory device 232 to the time domain of the transitional clock signal SYSCLK_PHASE. The interface 762 marks a transition of the incoming data DQ<M> from the time domain of the transitional clock signal SYSCLK_PHASE to the time domain of the system clock signal SYSCLK__90.

Figure 18:
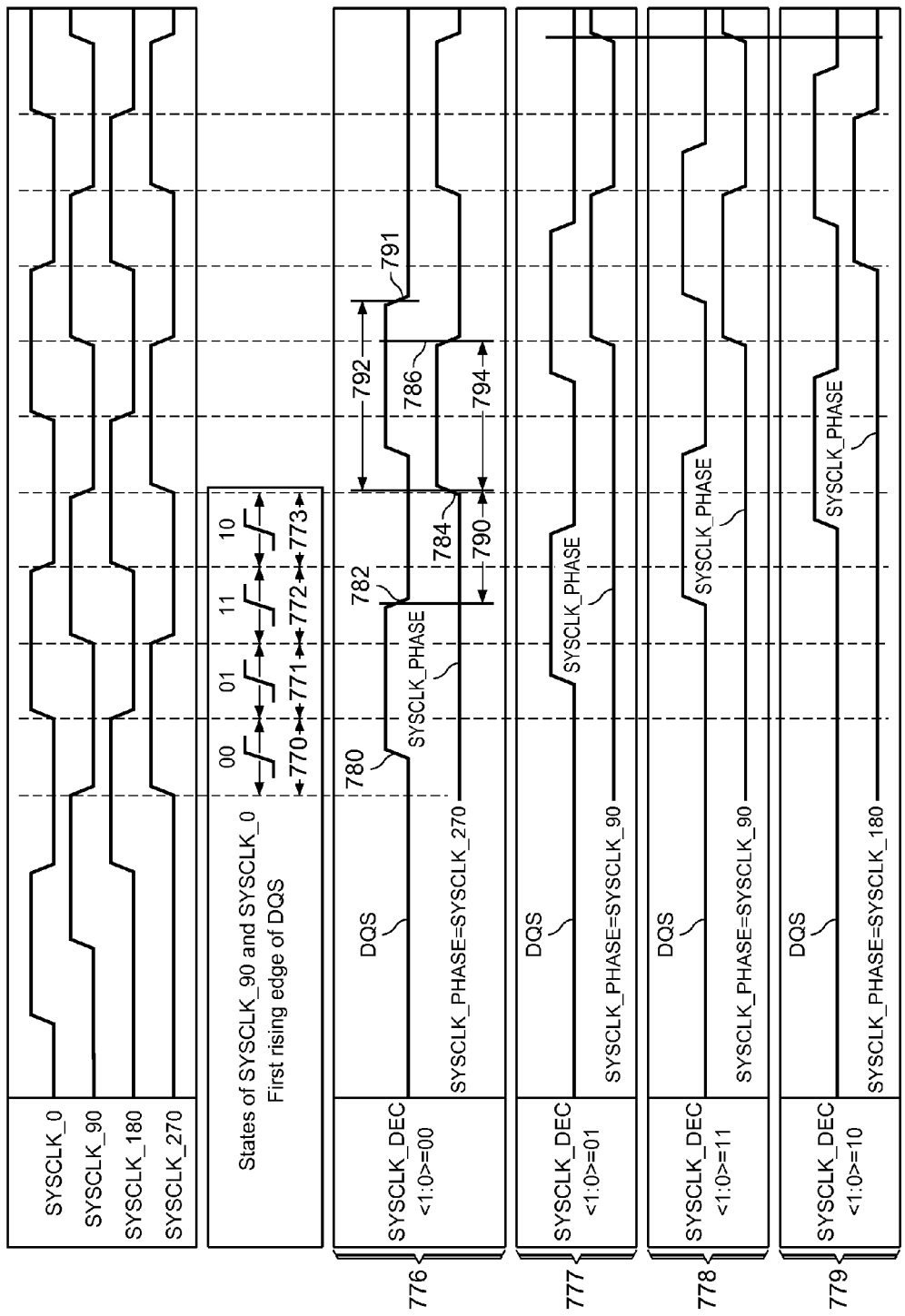
FIG. 18 is a timing diagram illustrating various signals in the circuitry of FIGS. 14-17.

FIG. 18 is a timing diagram illustrating the timing relationships between various signals discussed above in association with FIGS. 14-17. At the top of FIG. 18, the four system clocks SYSCLK__0, SYSCLK__90, SYSCLK__180 and SYSCLK__270 are shown. The signal SYSCLK__0 leads the signals SYSCLK__90, SYSCLK__180 and SYSCLK__270 in phase by 90 degrees, 180 degrees and 270 degrees, respectively.

Below the system clock signals, four time periods 770, 771, 772 and 773 together represent one full period of SYSCLK__90, and each cover a possible time window for the occurrence of the first rising edge of DQS, because DQS is asynchronous to the SYSCLK signals. As described above in association with FIG. 14, the decoding signals SYSCLK_DEC<1> and SYSCLK_DEC<0> have binary values 00, 01, 11 and 10 that reflect the states of the clock signals SYSCLK__90 and SYSCLK__0 at the time the signal DQS goes high. Since the decoding signals SYSCLK_DEC<1> and SYSCLK_DEC<0> are obtained using DQS as a clock signal, the current timing relationship between DQS and SYSCLK__90 is represented by the decoding signals SYSCLK_DEC<1> and SYSCLK_DEC<0>.

In more detail, when the decoding signals SYSCLK_DEC<1> and SYSCLK_DEC<0> have a binary value of 00, the first rising edge of DQS occurred within the time period 770. When the decoding signals SYSCLK_DEC<1> and SYSCLK_DEC<0> have a binary value of 01, the first rising edge of DQS occurred within the time period 771. When the decoding signals SYSCLK_DEC<1> and SYSCLK_DEC<0> have a binary value of 11, the first rising edge of DQS occurred within the time period 772. When the decoding signals SYSCLK_DEC<1> and SYSCLK_DEC<0> have a binary value of 10, the first rising edge of DQS occurred within the time period 773.

FIG. 18 also shows the timing relationship between the transitional clock signal SYSCLK_PHASE and the signal DQS for each of the four values 00, 01, 11 and 10 of the decoding signal SYSCLK_DEC<1:0>, at 776, 777, 778 and 779, respectively. The case 776 of the decoding signal SYSCLK_DEC<1:0> having the binary value of 00 is discussed below. As discussed previously in association with FIG. 16, when SYSCLK_DEC<1:0> has a value of 00, a signal equivalent to the clock signal SYSCLK_270 is selected as the transitional clock signal SYSCLK_PHASE. Referring to FIGS. 17 and 18, one bit of data from the incoming data DQ<M> is clocked into the flip flop 753 at the first rising edge 780 of DQS. At the first falling edge 782 of DQS, the data stored in the flip flop 753 is clocked into the flip flop 754, and another bit of data from the incoming data DQ<M> is clocked into the flip flop 757. Next, at the first rising edge 784 of the transitional clock signal SYSCLK_PHASE, the data bits stored in the flip flops 754 and 757 are respectively clocked into the flip flops 755 and 758. Thereafter, at the next rising edge 786 of SYSCLK_90 (designated by the vertical bar), the data bits stored in the flip flops 755 and 758 are respectively clocked into the flip flops 756 and 759.

As FIG. 18 illustrates, there is a sufficient amount of time 790 between the falling edge 782 of DQS and the rising edge 784 of SYSCLK_PHASE so that the flip flops 755 and 758 can respectively get data from the output of the flip flops 754 and 757 after the flip flops 754 and 757 are fully settled. There is also a sufficient amount of time 792 between the rising edge 784 of SYSCLK_PHASE and the falling edge 791 of DQS so that the flip flops 755 and 758 can respectively get data from the flip flops 754 and 757 before the next falling edge 791 of DQS occurs and changes the contents of the flip flops 754 and 757. Essentially, SYSCLK_PHASE is selected so that the rising edge 784 of SYSCLK_PHASE occurs approximately halfway between the first falling edge 782 and the second falling edge 791 of DQS. Thus, the incoming data DQ<M> can transition from the DQS domain to the SYSCLK_PHASE domain without loss or error. Furthermore, there is a sufficient amount of time 794 between the rising edge 784 of SYSCLK_PHASE and the rising edge 786 of SYSCLK_90 so that the incoming data DQ<M> can transition from the SYSCLK_PHASE domain to the SYSCLK_90 domain without loss or error.

Figure 19:
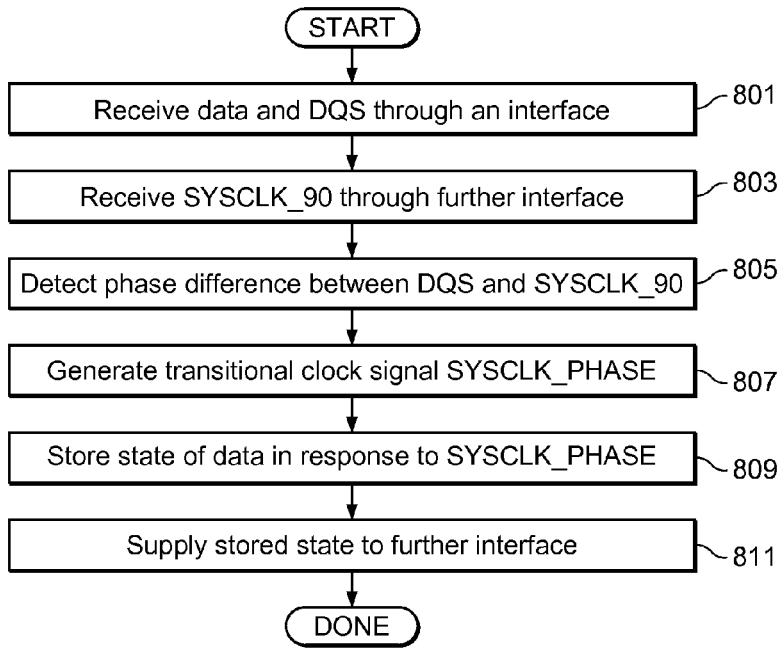
FIG. 19 is a high-level flowchart that summarizes aspects of the operation of the embodiment discussed above in association with FIGS. 1-18.

FIG. 19 is a high-level flowchart that summarizes aspects of the operation of the embodiment discussed above in association with FIGS. 1-18. In block 801, and with reference to FIGS. 16 and 17, data from the memory device and the signal DQS are received through an interface. In block 803, the system clock signal SYSCLK_90 is received through a further interface. The signal SYSCLK_90 is unsynchronized with respect to the signal DQS. In block 805, a phase difference between the signal DQS and the signal SYSCLK_90 is detected. In block 807, the transitional clock signal SYSCLK_PHASE is generated. SYSCLK_PHASE has a phase difference with respect to each of DQS and SYSCLK_90 that is a function of the phase difference between the signal DQS and the signal SYSCLK_90. In block 809, a state of the data is stored in response to the signal SYSCLK_PHASE. In block 811, the stored state of the incoming data is supplied to the further interface.

Figure 20:
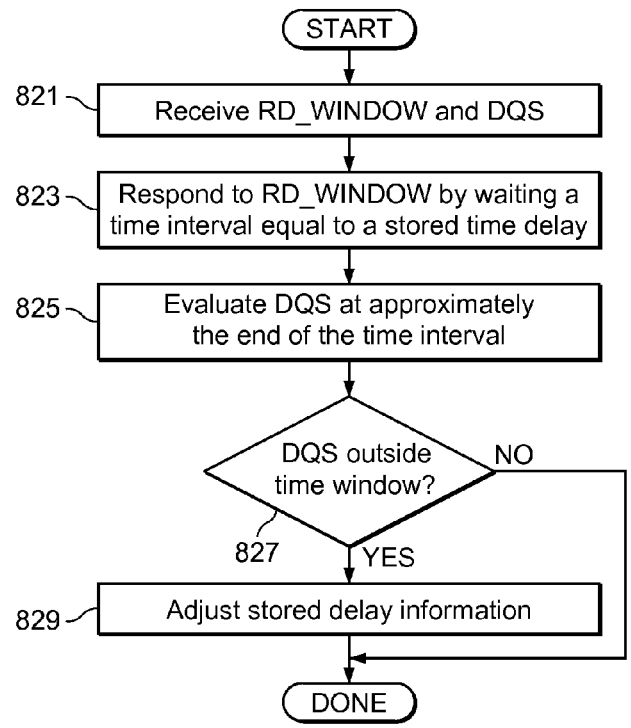
FIG. 20 is a high-level flowchart that summarizes other aspects of the operation of the embodiment discussed above in association with FIGS. 1-18.

FIG. 20 is a high-level flowchart that summarizes other aspects of the operation of the embodiment discussed above in association with FIGS. 1-18. In block 821, and with reference to FIG. 5, the signal DQS and the control signal RD_WINDOW are received. In block 823, an occurrence of RD_WINDOW causes a wait for a time interval equivalent to an expected time delay. In block 825, the signal DQS is evaluated at approximately the end of the time interval. In block 827, a decision is made as to whether DQS occurred outside a time window associated with the end of the time interval. If the decision is yes, the stored delay information is adjusted in block 829. Otherwise, block 829 is skipped.

Although a selected embodiment has been illustrated and described in detail, it should be understood that substitutions and alterations are possible without departing from the spirit and scope of the present invention, as defined by the claims that follow.

What is claimed is:

1. An apparatus comprising circuitry that includes:
a first interface through which first and second signals are received;
a second interface through which a third signal is received, wherein the third signal is unsynchronized with respect to the second signal;
a circuit that detects a first phase difference between the second and third signals, and that generates a fourth signal in a manner so that a second phase difference between the fourth signal and one of the second or third signals is a function of the first phase difference; and
a storage element having an input to which the first signal is applied, and having an output coupled to the second interface, wherein the storage element, in response to the fourth signal, stores a state of the first signal present at the input thereof and outputs to the output thereof the state stored therein.

2. The apparatus of claim 1, wherein the circuit, in response to the first phase difference, carries out the generating of the fourth signal by selecting one of a plurality of different digital signals having different phases to serve as the fourth signal.

3. The apparatus of claim 2, including an additional circuit that provides the digital signals, the digital signals including the third signal, wherein the digital signals other than the third signal have respective and unequal phase differences with respect to the third signal.

4. The apparatus of claim 3, wherein the digital signals include three signals other than the third signal, the three signals in the digital signals having respective frequencies that are approximately the same as a frequency of the third signal and having respective phase differences of approximately 90 degrees, approximately 180 degrees and approximately 270 degrees with respect to the third signal.

5. The apparatus of claim 2, wherein the circuit, in carrying out the detection of the first phase difference, generates first and second decoding signals that represent the first phase difference, and wherein the circuit includes a selector that uses the first and second decoding signals to select the fourth signal from the digital signals, the digital signals include the third signal.

6. The apparatus of claim 5, wherein the digital signals include a fifth signal, and wherein the circuit includes:
a further storage element having an input to which the third signal is applied, and having an output, wherein the further storage element, in response to the second signal, stores a state of the third signal present at the input thereof and outputs to the output thereof the state stored therein as the first decoding signal; and
an additional storage element having an input to which the fifth signal is applied, and having an output, wherein the additional storage element, in response to the second signal, stores a state of the fifth signal present at the input thereof and outputs to the output thereof the state stored therein as the second decoding signal.

7. The apparatus of claim 1, including first, second, and third storage elements, the second storage element is the storage element having the input to which the first signal is applied, wherein:
the first storage element has an input to which a fifth signal is applied, and has an output coupled to the input of the second storage element through the first interface, wherein the first storage element, in response to the second signal, stores a state of the fifth signal present at the input thereof and outputs to the output thereof the state stored therein as the first signal; and
the third storage element has an input that is coupled to the output of the second storage element through the second interface, and has an output, wherein the third storage element, in response to the third signal, stores a state of the output of the second storage element and outputs to the output of the third storage element the state stored therein.

8. The apparatus of claim 7, including a memory device that:
outputs one of a data signal or a control signal as the fifth signal; and
outputs a clock signal as the second signal.

9. The apparatus of claim 7, including an additional circuit that provides a plurality of signals having different phases, including the third signal, and a further circuit that receives the plurality of signals, wherein:
each of the signals other than the third signal in the plurality of signals has, with respect to the third signal, a respective phase difference selected from the group consisting of: approximately 90 degrees, approximately 180 degrees and approximately 270 degrees; and
the further circuit selects one of the signals from the plurality of signals to serve as the fourth signal.

10. The apparatus of claim 7, including fourth, fifth, sixth, and seventh storage elements, wherein:
the fourth storage element has an input to which the fifth signal is applied, and has an output, wherein the fourth storage element, in response to a sixth signal having a phase difference with respect to the second signal and being synchronized to the second signal, stores a state of the fifth signal present at the input thereof and outputs to the output thereof the state stored therein;
the fifth storage element has an input that is coupled to the output of the fourth storage element, and has an output, wherein the fifth storage element, in response to the second signal, stores a state of the output of the fourth storage element and outputs to the output of the fifth storage element the state stored therein;
the sixth storage element has an input that is coupled to the output of the fifth storage element, and has an output, wherein the sixth storage element, in response to the fourth signal, stores a state of the output of the fifth storage element and outputs to the output of the sixth storage element the state stored therein; and
the seventh storage element has an input that is coupled to the output of the sixth storage element, and has an output, wherein the seventh storage element, in response to the third signal, stores a state of the output of the sixth storage element and outputs to the output of the seventh storage element the state stored therein.

11. The apparatus of claim 10, wherein the storage elements each include a flip flop, and wherein the phase difference between the second signal and the sixth signal is approximately 180 degrees.

12. A method comprising:
receiving first and second signals through a first interface;
receiving a third signal through a second interface, the third signal is unsynchronized with respect to the second signal;
detecting a first phase difference between the second and third signals;
generating a fourth signal in a manner so that a second phase difference between the fourth signal and one of the second or third signals is a function of the first phase difference;
storing a state of the first signal in response to the fourth signal; and
supplying the stored state of the first signal to the second interface.

13. The method of claim 12, wherein the generating the fourth signal includes selecting one of a plurality of different digital signals having different phases to serve as the fourth signal.

14. The method of claim 13, further including generating the digital signals, the digital signals including the third signal, wherein the digital signals other than the third signal have respective and unequal phase differences with respect to the third signal.

15. The method of claim 14, wherein the generating the digital signals includes generating three signals other than the third signal as the digital signals, the three signals in the digital signals having respective frequencies that are approximately the same as a frequency of the third signal and having respective phase differences of approximately 90 degrees, approximately 180 degrees and approximately 270 degrees with respect to the third signal.

16. The method of claim 13, wherein the detecting of the first phase difference includes:
generating first and second decoding signals that represent the first phase difference; and
selecting the fourth signal from the digital signals using the first and second decoding signals, the digital signals include the third signal.

17. The method of claim 16, wherein the digital signals include a fifth signal, and further including:
storing a state of the third signal in response to the second signal and utilizing the stored state of the third signal as the first decoding signal; and
storing a state of the fifth signal in response to the second signal and utilizing the stored state of the fifth signal as the second decoding signal.

18. The method of claim 12,
including storing a state of a fifth signal in a first storage element in response to the second signal;
wherein the storing the state of the first signal includes storing the state from the first storage element as the first signal in a second storage element; and
includes storing a state from the second storage element in a third storage element in response to the third signal.

19. The method of claim 18, further including:
generating a plurality of signals having different phases, including the third signal; and
selecting one of the signals from the plurality of signals to serve as the fourth signal; wherein:
each of the signals other than the third signal in the plurality of signals has, with respect to the third signal, a respective phase difference selected from the group consisting of: approximately 90 degrees, approximately 180 degrees and approximately 270 degrees.

20. The method of claim 18, further including:
- storing a state of the fifth signal in a fourth storage element in response to a sixth signal having a phase difference with respect to the second signal and being synchronized to the second signal;
- storing a state from the fourth storage element in a fifth storage element in response to the second signal;
- storing a state from the fifth storage element in a sixth storage element in response to the fourth signal; and
- storing a state from the sixth storage element in a seventh storage element in response to the third signal.

* * * * *